United States Patent
Skaria et al.

(10) Patent No.: US 11,828,714 B2
(45) Date of Patent: Nov. 28, 2023

(54) IMAGE ACQUISITION BY AN ELECTRON BEAM EXAMINATION TOOL FOR METROLOGY MEASUREMENT

(71) Applicant: Applied Materials Israel Ltd., Rehovot (IL)

(72) Inventors: Bobin Mathew Skaria, Bangalore (IN); Anirban Ghosh, Bangalore (IN); Nitin Singh Malik, Bengaluru (IN); Shay Attal, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 563 days.

(21) Appl. No.: 17/039,694

(22) Filed: Sep. 30, 2020

(65) Prior Publication Data
US 2022/0099592 A1    Mar. 31, 2022

(51) Int. Cl.
*G01N 21/95*    (2006.01)
*H01L 21/66*    (2006.01)
*G01N 21/88*    (2006.01)

(52) U.S. Cl.
CPC ..... *G01N 21/9505* (2013.01); *G01N 21/8851* (2013.01); *H01L 22/12* (2013.01);
(Continued)

(58) Field of Classification Search
CPC .... G01N 23/04; G01N 23/2251; G01N 21/47; G01N 2223/612; G01N 2223/0565;
(Continued)

(56) References Cited

U.S. PATENT DOCUMENTS 7,817,860 B2   10/2010   Shishido et al.
9,830,524 B2   11/2017   Sekiguchi et al.
(Continued)

FOREIGN PATENT DOCUMENTS

WO   WO-2018001751 A1 *  1/2018   ............ G01N 21/47

OTHER PUBLICATIONS

Okai et al., "Methodology for determining CD-SEM measurement condition of sub-20nm resist patterns for 0.33 NA EUV lithography," In Metrology, Inspection, and Process Control for Microlithography XXIX (vol. 9424, p. 94240H). International Society for Optics and Photonics, 2015, 14 pages.
(Continued)

*Primary Examiner* — Michael P Stafira
(74) *Attorney, Agent, or Firm* — Loweinstein Sandler LLP

(57) ABSTRACT

There is provided a system and a method comprising obtaining a sequence of a plurality of frames of an area of a specimen, wherein at least one frame of the sequence is transformed with respect to another frame, obtaining a reference frame based at least on a first frame of the sequence, determining, based on the reference frame, a reference pattern, wherein the reference pattern is informative of a structural feature of the specimen in the area, for a given frame of the sequence, determining, based on the given frame, a pattern informative of said structural feature in the area, determining data $D_{shrinkage}$ informative of an amplitude of a spatial transformation between the reference pattern and the pattern, generating a corrected frame based on said pattern and $D_{shrinkage}$ and generating an image of the area.

20 Claims, 14 Drawing Sheets

(52) U.S. Cl.
CPC ............ *G01N 2021/8854* (2013.01); *G01N 2021/8887* (2013.01)

(58) Field of Classification Search
CPC ............ G01N 21/956; G01N 21/9501; G01N 2223/401; G01N 23/20083; G01N 23/205; G01N 21/45; G01N 21/49; G01N 21/554; G01N 2201/06113; G01N 23/041; G01N 11/00; G01N 15/1434; G01N 15/1468; G01N 2021/8887; G01N 21/8851; G01N 2203/0092; G01N 2203/0094; G01N 2223/03; G01N 2223/0566; G01N 2223/071; G01N 2223/1016; G01N 2223/102; G01N 2223/418; G01N 2223/501; G01N 23/20; G01N 23/201; G01N 23/2055; G01N 23/22; G01N 1/38; G01N 2021/0353; G01N 2021/1725; G01N 21/88; G01N 21/8806; G01N 21/95; G01N 2291/044; G01N 27/44791; G01N 29/04; G01N 29/0618; G01N 29/343; G01N 29/348; G01N 29/36; G01N 29/4454; G01N 1/06; G01N 1/30; G01N 1/36; G01N 2021/8854; G01N 21/8422; G01N 21/9505; G01N 2223/419; G01N 23/083; G01N 23/20008; G01N 23/20058; G01N 23/20075; G01N 27/62; G01N 27/9006; G01N 27/902; G01N 27/904; H01L 21/0274; H01L 21/0337; H01L 21/3081; H01L 21/0271; H01L 25/50; H01L 2924/12044; H01L 21/4867; H01L 21/6835; H01L 2221/68359; H01L 2224/05624; H01L 23/4985; H01L 25/0655; H01L 27/14601; H01L 2924/01019; H01L 2924/01046; H01L 2924/01057; H01L 2924/01079; H01L 2924/09701; H01L 2924/13091; H01L 2924/1461; H01L 2924/3025; H01L 21/3085; H01L 27/1218; H01L 2924/00; H01L 21/02164; H01L 21/02266; H01L 21/0228; H01L 21/2855; H01L 21/30604; H01L 21/3086; H01L 21/31144; H01L 21/76224; H01L 28/90; H01L 29/665; H01L 29/66515; H01L 29/6653; H01L 29/66545; H01L 29/6659; H01L 21/00; H01L 31/0201; H01L 31/022433; H01L 31/035272; H01L 31/046; H01L 31/0463; H01L 31/0465; H01L 31/0508; H01L 31/0516; H01L 21/268; H01L 31/101; H01L 21/027; H01L 21/32115; H01L 21/7684; H01L 21/76886; H01L 22/12; H01L 27/146; H01L 27/14643; H01L 21/02118; H01L 21/02288; H01L 21/208; H01L 21/302; H01L 21/3065; H01L 21/31055; H01L 22/20; H01L 2224/16225; H01L 2224/48091; H01L 2224/48227; H01L 2224/8592; H01L 2224/95085; H01L 2224/95145; H01L 24/95; H01L 2924/00014; H01L 2924/01005; H01L 2924/01006; H01L 2924/01013; H01L 2924/01033; H01L 2924/01074; H01L 2924/01075; H01L 2924/01082; H01L 2924/12041; H01L 2924/14; H01L 2924/1433; H01L 21/0275; H01L 27/1443; H01L 29/127; H01L 29/16; H01L 29/34; H01L 29/66439; H01L 29/66977; H01L 29/7613; H01L 31/02327; H01L 31/1848; H01L 31/1852
See application file for complete search history.

(56) References Cited

U.S. PATENT DOCUMENTS

| | | |
|---|---|---|
| 2008/0179517 A1 | 7/2008 | Kawada et al. |
| 2019/0080447 A1* | 3/2019 | Shkalim ................ G06T 7/0006 |
| 2019/0121113 A1 | 4/2019 | Takasugi et al. |
| 2020/0226744 A1* | 7/2020 | Cohen ..................... G06T 7/11 |
| 2020/0232934 A1* | 7/2020 | Feldman ................ G06T 7/001 |
| 2020/0234417 A1* | 7/2020 | Cohen ..................... G06T 7/001 |
| 2021/0109041 A1* | 4/2021 | Gaind ................ G01N 21/9505 |
| 2022/0082376 A1* | 3/2022 | Bistritzer .............. G06T 7/0004 |

OTHER PUBLICATIONS

Sullivan et al., Methodology for determining CD-SEM measurement condition of sub-20nm resist patterns for 0.33 NA EUV lithography. In Metrology, Inspection, and Process Control for Microlithography XXIX (vol. 9424, p. 94240H). International Society for Optics and Photonics, Mar. 2015, 10 pages.

* cited by examiner

IMAGE ACQUISITION BY AN ELECTRON BEAM EXAMINATION TOOL FOR METROLOGY MEASUREMENT

TECHNICAL FIELD

The presently disclosed subject matter relates, in general, to the field of examination of a specimen, and more specifically, to automating the examination of a specimen.

BACKGROUND

Current demands for high density and performance associated with ultra large-scale integration of fabricated devices require submicron features, increased transistor and circuit speeds, and improved reliability. Such demands require formation of device features with high precision and uniformity, which, in turn, necessitates careful monitoring of the fabrication process, including automated examination of the devices while they are still in the form of semiconductor wafers.

Examination processes are used at various steps during semiconductor fabrication to measure dimensions of the specimens, and/or to detect and classify defects on specimens (e.g. Automatic Defect Classification (ADC), Automatic Defect Review (ADR), etc.).

GENERAL DESCRIPTION

In accordance with certain aspects of the presently disclosed subject matter, there is provided an electron beam examination system, configured to sequentially acquire a sequence of a plurality of frames of an area of a semiconductor specimen, wherein at least one frame of the sequence is transformed with respect to another frame of the sequence, wherein the electron beam examination system comprises a processor and memory circuitry (PMC) configured to obtain a reference frame, wherein the reference frame is based at least on a first frame of the sequence, determine, based on the reference frame, a reference pattern, wherein the reference pattern is informative of a structural feature of the specimen in the area, for a given frame of the sequence, which is not the first frame, determine, based on the given frame, a pattern informative of said structural feature in the area, determine data $D_{shrinkage}$ informative of an amplitude of a spatial transformation between the reference pattern and the pattern, generate a corrected frame associated with a corrected pattern informative of said structural feature, wherein the corrected pattern is based on said pattern and $D_{shrinkage}$, and generate an image of the area using at least the corrected frame, wherein the image is usable for determination of metrology data of the specimen in the area.

According to some embodiments, $D_{shrinkage}$ reflects an amplitude of a transformation of the structural feature between the given frame and the reference frame due at least to impingement of an electron beam of the electron beam examination system on the structural feature.

According to some embodiments, the corrected pattern of the corrected frame is generated based on said pattern and $D_{shrinkage}$ to match, at least partially, the reference pattern of the reference frame.

According to some embodiments, the system is configured to obtain the sequence of the plurality of frames and output the image during run-time scanning of the specimen.

According to some embodiments, the system is configured to (1) for a given frame of the sequence, obtain a reference frame, wherein the reference frame is based at least on a first frame of the sequence, determine, based on the reference frame, a reference pattern, wherein the reference pattern is informative of a structural feature of the specimen in the area, determine, based on the given frame, a pattern informative of said structural feature in the area, determine data $D_{shrinkage}$ informative of an amplitude of a spatial transformation between the reference pattern and the second pattern, generate a corrected frame associated with a corrected pattern informative of said structural feature, wherein the corrected pattern is based on said pattern and $D_{shrinkage}$, (2) repeat (1) for another frame of the sequence, different from the given frame, thereby obtaining a plurality of corrected frames, generate an image of the area using the plurality of corrected frames, wherein the image is usable for determination of metrology data of the specimen in the area.

According to some embodiments, the system is configured to, at (1), for a given frame of the sequence, generate the reference frame using a corrected frame previously obtained for a frame of the sequence which is not the given frame.

According to some embodiments, the system is configured to determine, based on the reference frame, a plurality of given reference patterns, wherein each given reference pattern is informative of a given structural feature of the specimen in the area, for a given frame of the sequence, which is not the first frame, for each given reference pattern informative of a given structural feature, determine, based on the given frame, a given pattern which is informative of said given structural feature in the area, determine data $D_{shrinkage/given}$ informative of an amplitude of a spatial transformation between the given reference pattern and the given pattern, generate a given corrected frame, wherein, for each given structural feature, the given corrected frame is associated with a given corrected pattern informative of said given structural feature, wherein the given corrected pattern is based on said given pattern and $D_{shrinkage/given}$ specifically obtained for said given pattern, generate an image of the area using at least the given corrected frame, wherein the image is usable for determination of metrology data of the specimen in the area.

According to some embodiments, the system is configured to determine first data $D_{shrinkage/given,1}$ informative of an amplitude of a spatial transformation between a first given reference pattern and a first given pattern, and determine second data $D_{shrinkage/given,2}$ informative of an amplitude of a spatial transformation between a second given reference pattern and a second given pattern, wherein $D_{shrinkage/given,1}$ is different from $D_{shrinkage/given,2}$, wherein the corrected frame is associated with a first given corrected pattern informative of the first given structural feature, wherein the first given corrected pattern is based on said first given pattern and $D_{shrinkage/given,1}$ specifically obtained for said first given pattern, and a second given corrected pattern informative of the second given structural feature, wherein the second given corrected pattern is based on said second given pattern and $D_{shrinkage/given,2}$ specifically obtained for said second given pattern.

According to some embodiments, the system is configured to determine, in a pixel intensity profile of the reference frame, a reference pixel intensity function informative of a structural feature of the specimen in the area, for a given frame of the sequence, determine, in a pixel intensity profile of the given frame, a pixel intensity function informative of said structural feature in the area, determine data $D_{shrinkage}$ informative of an amplitude of a spatial transformation between the reference pixel intensity function and the pixel intensity function, generate a corrected frame, wherein a pixel intensity profile of the corrected frame comprises a corrected pixel intensity function informative of said structural feature, determined based on said pixel intensity function and $D_{shrinkage}$, and generate an image of the area using at least the corrected frame.

According to some embodiments, the system is configured to correct a position of the pixel intensity function based on $D_{shrinkage}$, to obtain the corrected pixel intensity function.

According to some embodiments, the system is configured to determine, in a pixel intensity profile of the reference frame, a plurality of given reference pixel intensity functions, wherein each given reference pixel intensity function is informative of a given structural feature of the specimen in the area, for a given frame of the sequence, for each given reference pixel intensity function informative of a given structural feature, determine, in a pixel intensity profile of the given frame, a given pixel intensity function informative of said given structural feature in the area, determine data $D_{shrinkage/given}$ informative of an amplitude of a spatial transformation between the given reference pixel intensity function and the given pixel intensity function, generate a corrected frame, wherein, for each given structural feature, a pixel intensity profile of the corrected frame comprises a corrected given pixel intensity function informative of said given structural feature, determined based on said given pixel intensity function and $D_{shrinkage/given}$ specifically obtained for said given pixel intensity function, and generate an image of the area using at least the corrected frame.

In accordance with certain aspects of the presently disclosed subject matter, there is provided a method of examination of a semiconductor specimen, the method comprising by a processor and memory circuitry (PMC), obtaining a sequence of a plurality of frames of an area of the semiconductor specimen, sequentially acquired by an electron beam examination tool, wherein at least one frame of the sequence is transformed with respect to another frame of the sequence, obtaining a reference frame based at least on a first frame of the sequence, determining, based on the reference frame, a reference pattern, wherein the reference pattern is informative of a structural feature of the specimen in the area, for a given frame of the sequence, which is not the first frame, determining, based on the given frame, a pattern informative of said structural feature in the area, determining data $D_{shrinkage}$ informative of an amplitude of a spatial transformation between the reference pattern and the pattern, generating a corrected frame associated with a corrected pattern informative of said structural feature, wherein the corrected pattern is based on said pattern and $D_{shrinkage}$, and generating an image of the area using at least the corrected frame, wherein the image is usable for determination of metrology data of the specimen in the area.

According to some embodiments, the corrected pattern of the corrected frame is generated based on said pattern and $D_{shrinkage}$ to match, at least partially, the reference pattern of the reference frame.

According to some embodiments, the method comprises obtaining the sequence of the plurality of frames and outputting the image during run-time scanning of the specimen by the electron beam examination tool.

According to some embodiments, the method comprises determining, based on the reference frame, a plurality of given reference patterns, wherein each given reference pattern is informative of a given structural feature of the specimen in the area, for a given frame of the sequence, which is not the first frame, for each given reference pattern informative of a given structural feature, determining, based on the given frame, a given pattern which is informative of said given structural feature in the area, determining data $D_{shrinkage/given}$ informative of an amplitude of a spatial transformation between the given reference pattern and the given pattern, generating a given corrected frame, wherein, for each given structural feature, the given corrected frame is associated with a given corrected pattern informative of said given structural feature, wherein the given corrected pattern is based on said given pattern and $D_{shrinkage/given}$ specifically obtained for said given pattern, generating an image of the area using at least the given corrected frame, wherein the image is usable for determination of metrology data of the specimen in the area.

According to some embodiments, the method comprises determining first data $D_{shrinkage/given,1}$ informative of an amplitude of a spatial transformation between a first given reference pattern and a first given pattern, and determining second data $D_{shrinkage/given,2}$ informative of an amplitude of a spatial transformation between a second given reference pattern and a second given pattern, wherein $D_{shrinkage/given,1}$ is different from $D_{shrinkage/given,2}$, wherein the corrected frame is associated with a first given corrected pattern informative of the first given structural feature, wherein the first given corrected pattern is based on said first given pattern and $D_{shrinkage/given,1}$ specifically obtained for said first given pattern, a second given corrected pattern informative of the second given structural feature, wherein the second given corrected pattern is based on said second given pattern and $D_{shrinkage/given,2}$ specifically obtained for said second given pattern.

According to some embodiments, the method comprises determining, in a pixel intensity profile of the reference frame, a reference pixel intensity function informative of a structural feature of the specimen in the area, for a given frame of the sequence, determining, in a pixel intensity profile of the given frame, a pixel intensity function informative of said structural feature in the area, determining data $D_{shrinkage}$ informative of an amplitude of a spatial transformation between the reference pixel intensity function and the pixel intensity function, generating a corrected frame, wherein a pixel intensity profile of the corrected frame comprises a corrected pixel intensity function informative of said structural feature, determined based on said pixel intensity function and $D_{shrinkage}$, and generating an image of the area using at least the corrected frame.

According to some embodiments, the method comprises determining first data $D_{shrinkage/given,1}$ informative of an amplitude of a spatial transformation between a first given reference pattern and a first given pattern, and determining second data $D_{shrinkage/given,2}$ informative of an amplitude of a spatial transformation between a second given reference pattern and a second given pattern, wherein $D_{shrinkage/given,1}$ is different from $D_{shrinkage/given,2}$, wherein the corrected frame is associated with a first given corrected pattern informative of the first given structural feature, wherein the first given corrected pattern is based on said first given pattern and $D_{shrinkage/given,1}$ specifically obtained for said first given pattern, a second given corrected pattern informative of the second given structural feature, wherein the second given corrected pattern is based on said second given pattern and $D_{shrinkage/given,2}$ specifically obtained for said second given pattern.

According to some embodiments, the method comprises determining, in a pixel intensity profile of the reference frame, a reference pixel intensity function informative of a structural feature of the specimen in the area, for a given frame of the sequence, determining, in a pixel intensity profile of the given frame, a pixel intensity function informative of said structural feature in the area, determining data $D_{shrinkage}$ informative of an amplitude of a spatial transformation between the reference pixel intensity function and the pixel intensity function, generating a corrected frame, wherein a pixel intensity profile of the corrected frame comprises a corrected pixel intensity function informative of said structural feature, determined based on said pixel intensity function and $D_{shrinkage}$, and generating an image of the area using at least the corrected frame.

According to some embodiments, the method comprises correcting a position of the pixel intensity function based on $D_{shrinkage}$, to obtain the corrected pixel intensity function.

According to some embodiments, the method comprises at least one of converting a two-dimensional representation of the structural feature in the reference frame into the reference pixel intensity function, and converting a two-dimensional representation of the structural feature in the frame into the pixel intensity function.

In accordance with certain other of the presently disclosed subject matter, there is provided a non-transitory computer readable medium comprising instructions that, when executed by a processor, cause the processor to perform operations as described above.

Among advantages of certain embodiments of the presently disclosed subject matter is to improve quality of images of a semiconductor specimen acquired by an electron beam examination tool, despite shrinkage of the structural elements of the specimen due to impingement of an electron beam on the structural features. The proposed solution therefore facilitates and improves quality of metrology data acquisition. In addition, the proposed solution improves process control. The proposed solution is efficient even in a context of tight process nodes, such as Extreme Ultraviolet Lithography (EUV). According to some embodiments, the proposed solution requires neither cumbersome and time-consuming modeling, nor prior knowledge on the shrinkage. According to some embodiments, the proposed solution does not require reduction of the dose of electrons. According to some embodiments, the proposed solution is robust and is invariant to the number of frames of a specimen used for generating a final image of the specimen. Lastly, according to some embodiments, the proposed solution can provide corrected images in real time, during scanning of the specimen.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
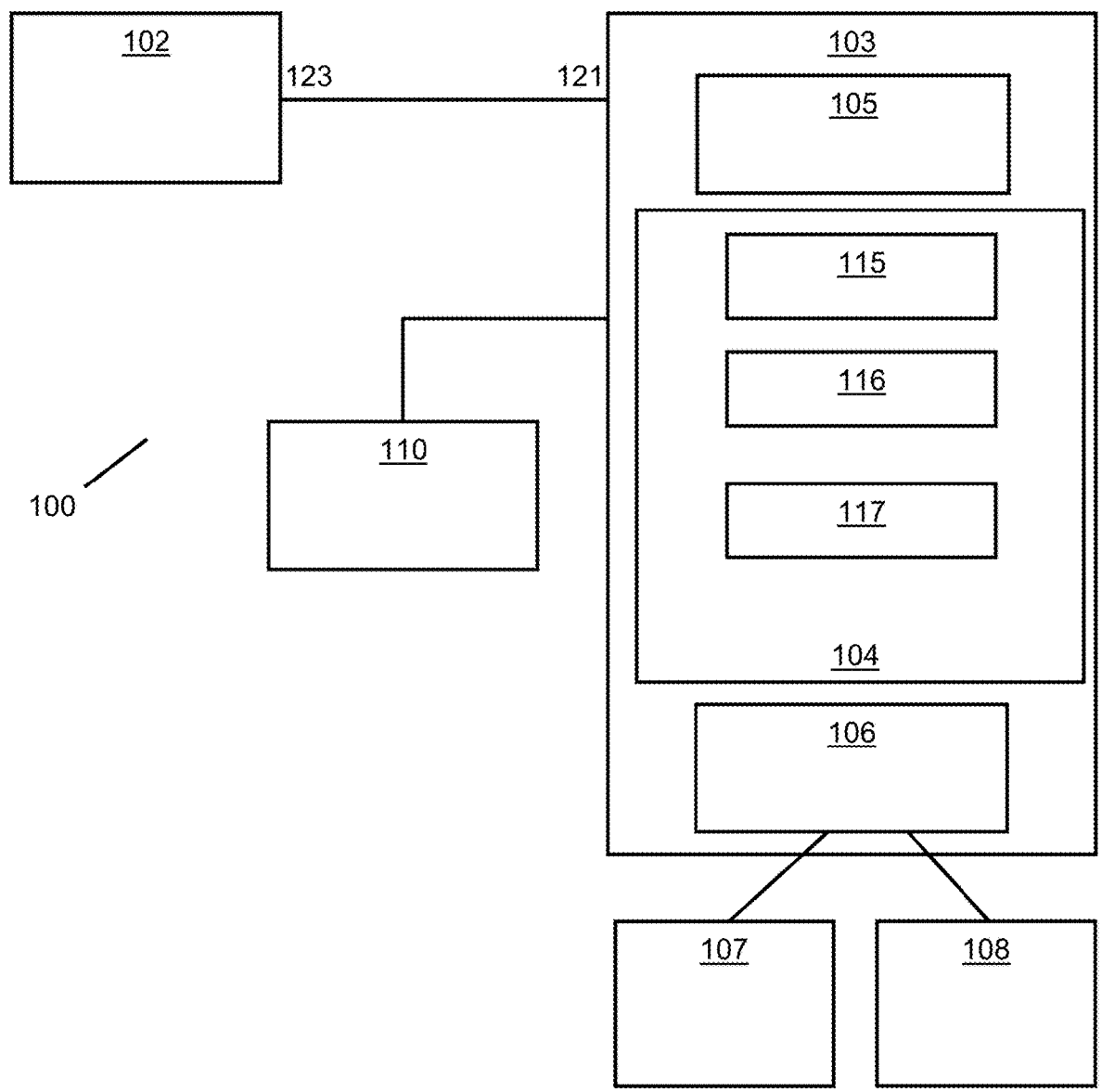
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "obtaining", "determining", "generating", "outputting", "correcting", "converting", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the system 103 and respective parts thereof disclosed in the present application.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined and can include, for example, generating an examination recipe(s) and/or other setup operations. It is noted that, unless specifically stated otherwise, the term "examination" or its derivatives used in this specification are not limited with respect to resolution or size of an inspection area.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats such as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter. The examination system 100 illustrated in FIG. 1 can be used for examination of a specimen (e.g. of a wafer and/or parts thereof) as part of the specimen fabrication process.

The illustrated examination system 100 comprises computer-based system 103 capable of generating images based on data acquired by an examination tool. In some embodiments, system 103 is further configured to automatically determine metrology-related and/or defect-related information using the generated images. System 103 can be operatively connected to one or more electron beam examination tools 102 (which generally correspond to one or more high-resolution examination tools 102) and/or other examination tools. In some embodiments, system 103 is part of examination tool 102.

Examination tool 102 can include e.g. a scanning electron microscope (SEM). Examination tool 102 can include inter alia a source producing an illumination electron beam, a scanner optically connected to the light source, and imaging detectors collecting back-scattered electrons. Examination tool 102 can be configured to scan a specimen during a run-time examination phase, based on one or more examination recipes indicative of the parameters (e.g. location, speed, etc.) of the scan.

System 103 includes a processor and memory circuitry (PMC) 104 operatively connected to an input interface 105 (which is e.g. hardware-based) and to an output interface 106 (which is e.g. hardware-based). PMC 104 is configured to provide all processing necessary for operating the system 103 as further detailed hereinafter (see methods described in FIGS. 2 to 6, which can be performed at least partially by system 103) and includes a processor (not shown separately) and a memory (not shown separately). The processor of PMC 104 can be configured to execute several functions in accordance with computer-readable instructions implemented on a non-transitory computer-readable memory comprised in the PMC). The processor of PMC 104 can be configured to execute several functional modules in accordance with computer-readable instructions implemented on a non-transitory computer-readable memory comprised in the PMC. Such functional modules (see references 115, 116 and 117) are referred to hereinafter as comprised in the PMC.

System 103 is configured to receive, via input interface 105, input data 121. Input data 121 can include data (and/or derivatives thereof and/or metadata associated therewith) produced by examination tool 102.

In particular, and as explained hereinafter, input data 121 can include frames of an area of the specimen. The frames can correspond e.g. to frames sequentially acquired by examination tool 102, which have a low signal to noise ratio (relative to the final image). It is noted that the frames can be received and processed together with metadata (e.g. pixel size, parameters of frame capturing process, etc.) associated therewith.

A frame corrector 115 is configured to correct one or more of the plurality of frames, according to various methods described hereinafter. Based on the corrected frames, an image generator 116 is configured to generate an image of the area (the image has a higher signal to noise ratio than the frames). The generated image can be used by an analysis module 117, which can perform various analyses such as (but not limited to) metrology analysis (measurement of critical dimensions, analysis of shapes of structural elements, etc.) and/or defect analysis.

In some embodiments, system 103 is further configured to send, via output interface 106, the images (or part thereof) to a storage system 107, to examination tool(s) 102, to a computer-based graphical user interface (GUI) 108 for rendering the results and/or to external systems (e.g. Yield Management System (YMS) of a FAB). GUI 108 can be further configured to enable user-specified inputs related to operating system 103. In some embodiments, system 103 can exchange data with a CAD server 110 storing design data.

Upon processing the input data, system 103 can send the results (e.g. instruction-related data 123) to any of the examination tool(s) 102, store the results (e.g. critical dimension measurements, etc.) in storage system 107, render the results via GUI 108 and/or send to an external system (e.g. to YMS).

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in other embodiments at least one of examination tool 102, system 107 and/or GUI 108 can be external to the examination system 100 and operate in data communication with system 103 via input interface 105 and output interface 106. System 103 can be implemented as stand-alone computer(s) to be used in conjunction with the examination tools. Alternatively, the respective functions of the system can, at least partly, be integrated with one or more examination tools.

Figure 2:
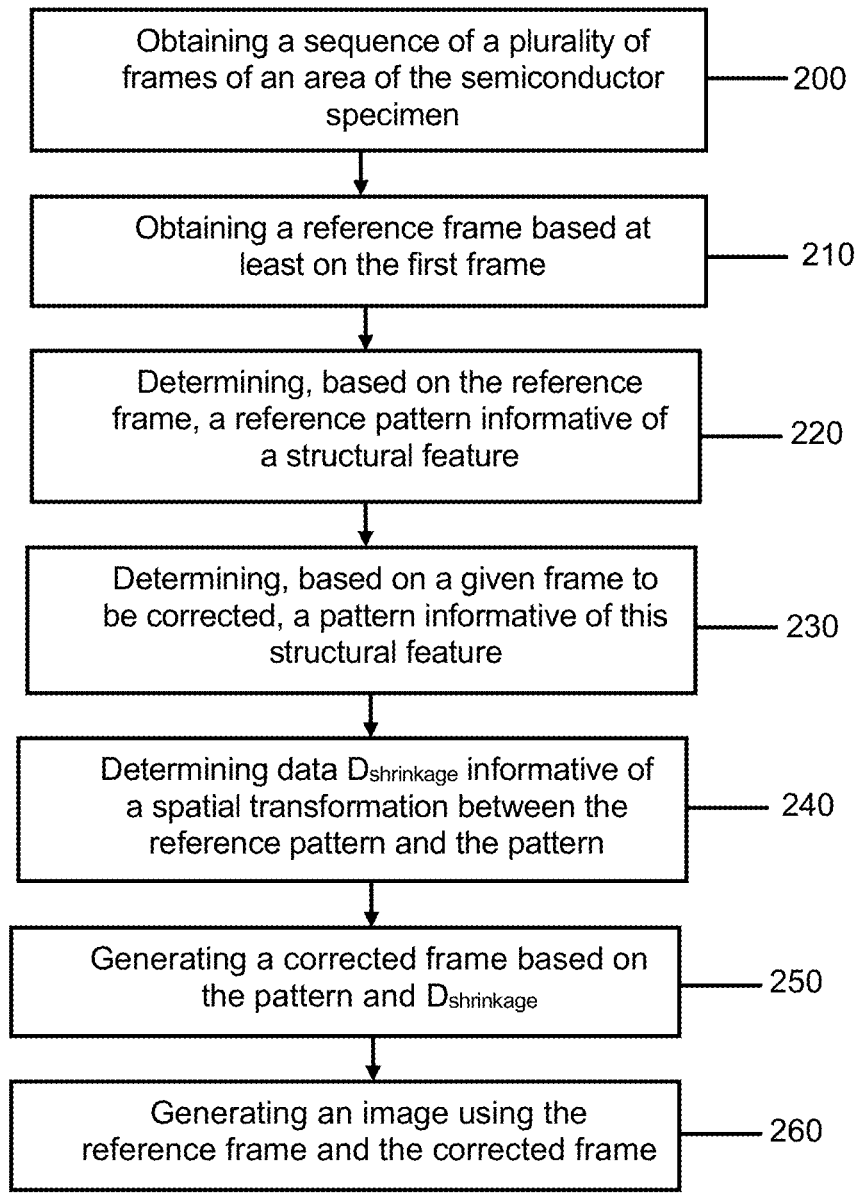
FIG. 2 illustrates a generalized flow-chart of a method of generating an improved image of a specimen acquired by an electron beam examination tool.

Attention is now drawn to FIG. 2, which describes a method of examination of a semiconductor specimen.

The method includes (operation 200) obtaining a sequence of a plurality of frames of an area of the semiconductor specimen, sequentially acquired by an electron beam examination tool. The electron beam examination tool can correspond in particular to a scanning electron microscope (SEM), as described with respect to reference 102 above.

In some embodiments, the frames correspond to frames of the specimen which have a reduced signal to noise ratio.

As a consequence of an impact of the electron beam on the specimen, the specimen is physically damaged. This phenomenon is called "shrinkage" or "slimming". A typical amplitude of this phenomenon is e.g. between 5% to 10% of the dimensions of the structural feature.

Although the frames correspond to an acquisition of the same area by the electron beam examination tool, due to the shrinkage of the specimen at least one frame of the sequence is transformed with respect to another frame of the sequence.

Figure 2A:
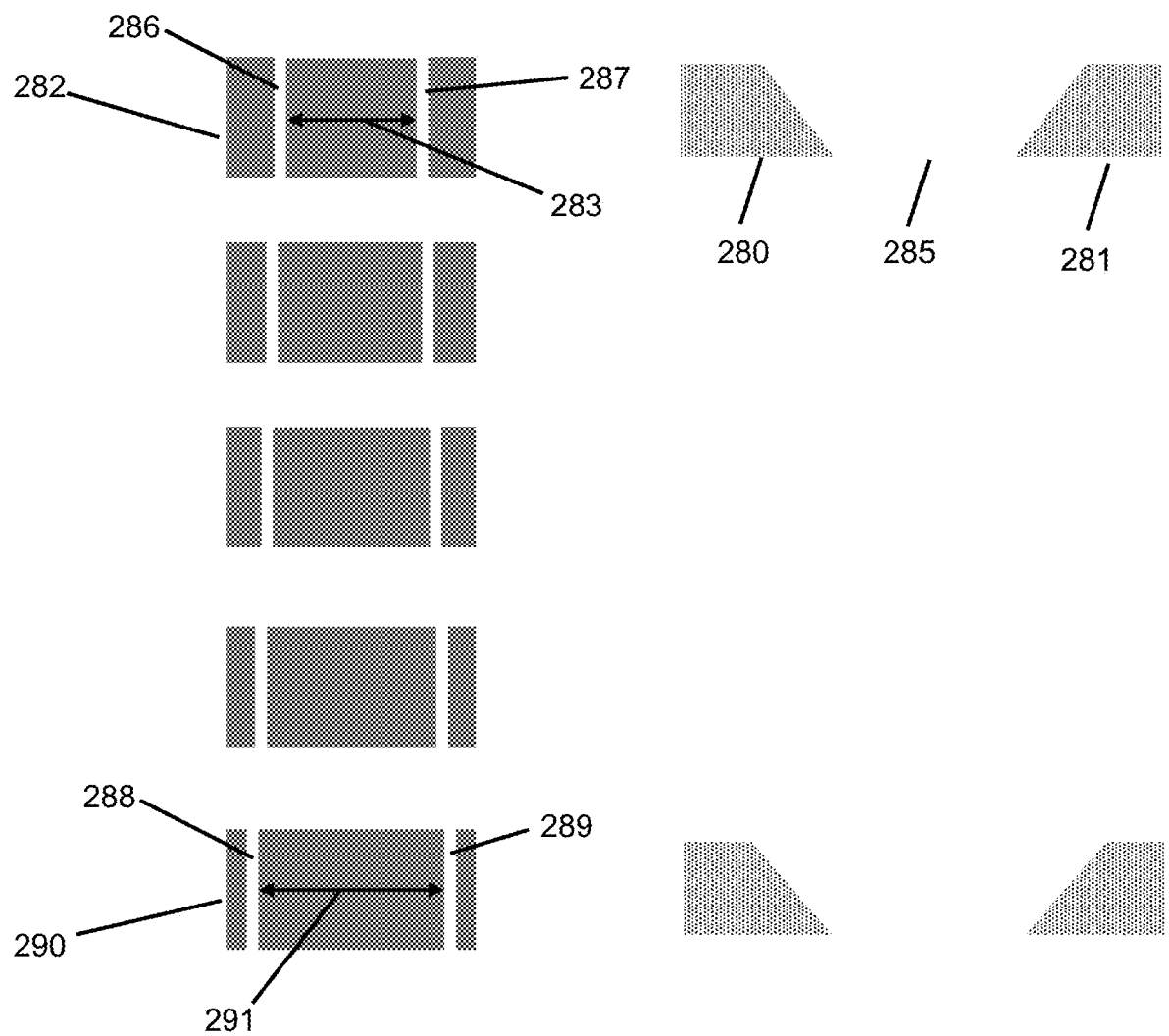
FIG. 2A illustrates frames of an area sequentially acquired by an electron beam examination tool, and which can be processed according to the method of FIG. 2.

This is schematically depicted in FIG. 2A. Assume that the area includes two structural elements 280 and 281, separated by a hole 285. In the first frame 282 of the sequence, the distance between the two structural elements (represented respectively as 286 and 287 in the first frame 282) is equal to a first distance 283. Due to shrinkage of the structural elements 280, 281 (illustrated on the bottom right side of FIG. 2A), this distance is increased in the subsequent frames of the sequence. For example, in frame 290, the distance between the two structural elements (represented respectively as 288 and 289 in the last frame 290) is represented as reference 291, which is larger than distance 283.

The method further includes obtaining (operation 210) a reference frame. The reference frame is based at least on a first frame of the sequence of plurality of frames.

Applicants discovered that in a sequence of a plurality of frames acquired by the electron beam examination tool, the first frame of the sequence corresponds to an area of the specimen with less damage(s) (due to "shrinkage") than the same area as acquired in subsequent frames of the plurality of frames. Therefore, according to some embodiments, the first frame can be used in generating a reference frame usable to correct other frames of the sequence.

In some embodiments, obtaining (operation 210) the reference frame includes selecting the first frame of the sequence as a reference frame.

In some embodiments, operation 210 includes generating the reference frame using frames of the sequence.

Assume that N frames ($F_1, \ldots, F_N$) of an area have been sequentially acquired in a given sequence of frame acquisition of the area. As mentioned above, the frames acquired by the electron beam examination tool (which have generally a reduced signal to noise ratio) are subsequently aggregated to generate the final image (e.g. by summing them). Although the first frame corresponds to the frame for which the structural features in the area have the lowest level of damages, it can be required to increase signal to noise of the first frame, to facilitate further processing (see subsequent operations described hereinafter, in which the frames are corrected based on the reference frame). The reference frame can be based on the first frame $F_1$, and one or more subsequent initial frames $F_j$ (with $1<j<<N$), in order to increase signal to noise of the first frame $F_1$. The value of j can be set e.g. by an operator and is generally selected as much smaller than N (using a small value for "j" provides better accuracy, since the initial frames are less impacted by the effect of the electron beam on the specimen than the other frames). The reference frame can be generated e.g. by summing all frames $F_1$ to $F_j$. This is not limitative, and in some embodiments (see e.g. explanations relative to FIG. 2B), the reference frame can be continuously improved: a current reference frame is used to generate a corrected frame which is then added to the current reference frame to generate a new reference frame (which can be then used to generate the next corrected frame which can be used, in turn, to improve the new reference frame). The process can be repeated iteratively.

In some embodiments, and as explained hereinafter with respect to FIG. 2B, if a frame of the sequence has already been corrected into a corrected frame, the reference frame can be generated using at least this corrected frame.

Once the reference frame has been obtained, it is attempted to correct one or more frames of the sequence of frames, based on the reference frame.

The method can include determining (operation 220), based on the reference frame, a reference pattern, wherein the reference pattern is informative of a structural feature of the specimen in the area.

As explained hereinafter, the reference pattern, which is informative of a structural feature of the specimen in the area, can correspond e.g. to a pixel intensity peak or function associated with the structural feature in a pixel intensity profile (e.g. average pixel intensity) of the reference frame, and/or to an image of the structural feature in the reference frame.

Assume that a sequence of frames $F_1$ to $F_N$ of the area have been acquired, and that a reference frame $F_{REF}$ has been obtained. The method can include correcting at least one given frame $F_k$ of the sequence, and in particular, which is not the first frame (and therefore generally differs from the first frame due to shrinkage).

The method can include determining (operation 230), based on the given frame $F_k$ to be corrected, a pattern informative of the same structural feature in the area (as mentioned above, the reference pattern is informative of a structural feature in the area, and therefore, the pattern is selected to be informative of the same structural feature).

The method can include determining (operation 240) data $D_{shrinkage}$ informative of an amplitude of a spatial transformation between the reference pattern and the pattern. As mentioned above, impingement of the electron beam damages the specimen. As a consequence, a spatial transformation exists between the reference pattern and the pattern, characterized by an amplitude which is denoted $D_{shrinkage}$. $D_{shrinkage}$ therefore reflects a transformation of the structural feature between the reference frame and the given frame $F_k$ due at least to impingement of an electron beam of the electron beam examination tool on the structural feature. In some embodiments, the amplitude of the transformation can vary depending on the direction, and $D_{shrinkage}$ can correspond e.g. to an average amplitude.

The method further includes generating (operation 250) a corrected frame $F'_k$. This corrected frame is associated with a corrected pattern informative of the structural feature. The corrected pattern can be generated based on the pattern and $D_{shrinkage}$. As explained hereinafter, the pattern can be corrected according to a spatial transformation whose amplitude is equal to $D_{shrinkage}$. In particular, the corrected pattern of the corrected frame can be generated based on the pattern and $D_{shrinkage}$ to match, at least partially, the reference pattern of the reference frame. In other words, effect of the shrinkage is reduced or even eliminated in the corrected frame, for this structural feature.

The method further includes generating (operation 260) an image of the area using the corrected frame $F'_k$. The generation can include e.g. summing the reference frame and the corrected frame $F'_k$ (together e.g. with other frames of the sequence and/or other corrected frames corrected as explained above).

Although the method of FIG. 2 has been described for a given frame $F_k$ of the sequence, which has been corrected into a corrected frame $F'_k$, the method can be used to correct more than one given frame.

For example, assume that a sequence of frames includes frames $F_1$ to $F_N$. Assume that the first frame $F_1$ is selected as a reference frame. The method can include correcting each frame $F_2$ to $F_N$, based on the reference frame $F_1$, in compliance with the method of FIG. 2. The method therefore outputs corrected frames $F'_2$ to $F'_N$. The method includes generating an image using at least the reference frame $F_1$ and the corrected frames $F'_2$ to $F'_N$. This can include e.g. summing frames $F_1$ and $F'_2$ to $F'_N$.

Figure 2B:
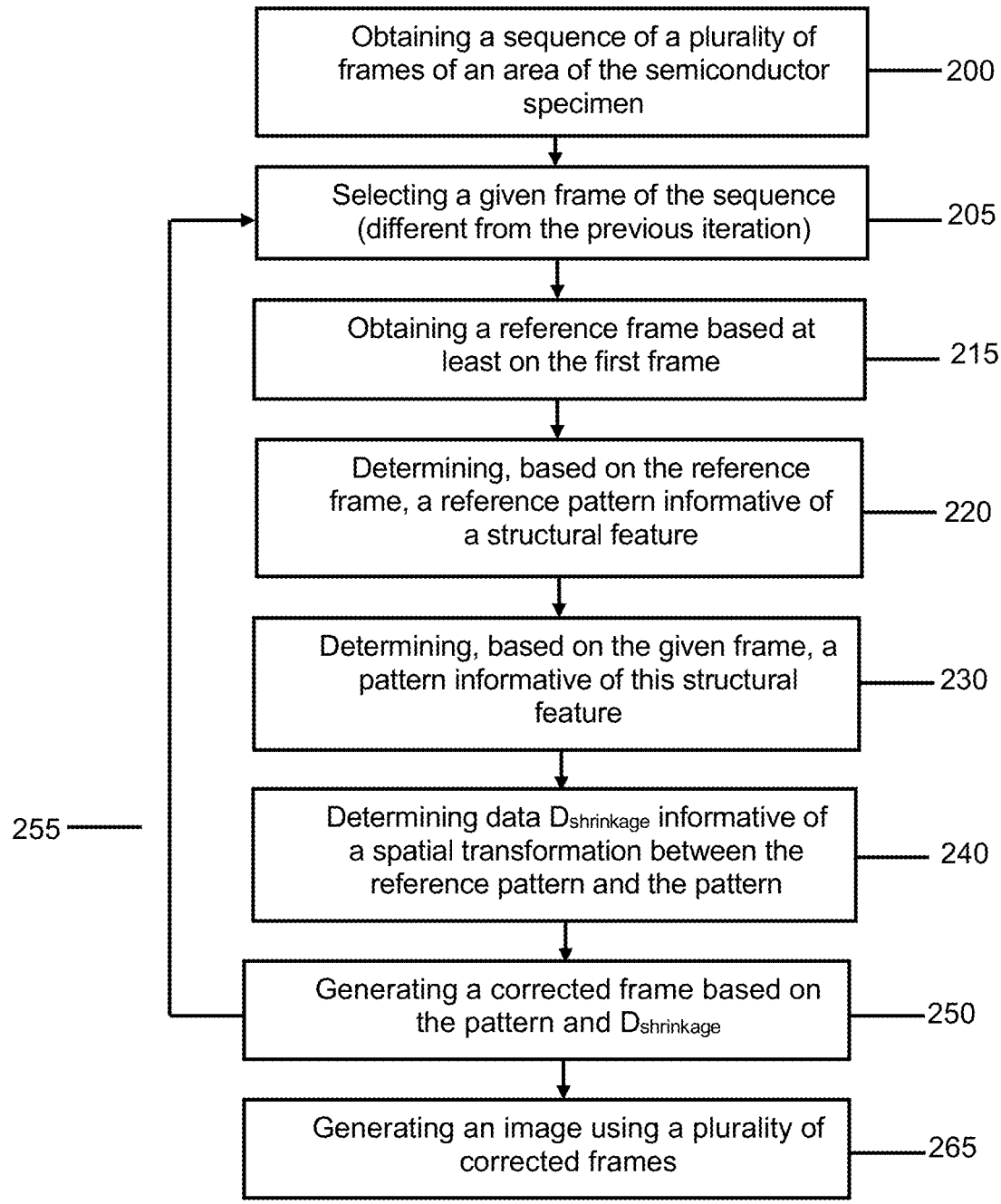
FIG. 2B illustrates a generalized flow-chart of a method of correcting a plurality of frames of a specimen sequentially acquired by an electron beam examination tool and generating a corresponding improved image of the specimen.

Attention is drawn to FIG. 2B, which describes a method of correcting a plurality of frames.

The method includes (operation 200—similar to FIG. 2) obtaining a sequence of a plurality of frames of an area of the semiconductor specimen. The method includes selecting (operation 205) a given frame of the sequence to be corrected. The given frame is generally selected as different from the first frame. The method includes obtaining (operation 215) a reference frame. As mentioned above, the reference frame can be obtained based at least on the first frame of the sequence. The method includes determining, based on the reference frame, a reference pattern informative of a structural feature (operation 220, similar to FIG. 2). The method includes determining, based on the given frame (selected at 205), a pattern informative of this structural feature (operation 230, similar to FIG. 2). The method includes determining data $D_{shrinkage}$ informative of a spatial transformation between the reference pattern and the pattern (operation 240, similar to FIG. 2). The method includes generating a corrected frame based on the pattern and $D_{shrinkage}$ (operation 250, similar to FIG. 2). It will be explained with reference to FIG. 3 that the method can be repeated for each of a plurality of reference patterns (in the reference frame) and associated patterns (in the given frame).

As shown in reference 255, the method can be repeated. In particular, it can be reverted to operation 205, at which another given frame of the sequence (different from the given frame processed at the previous iteration) is selected. Operations 215 to 250 are repeated, to obtain an additional corrected frame.

According to some embodiments, when operation 215 is repeated for a new given frame, a different reference frame can be obtained, which is different from a reference frame previously used to correct another frame of the sequence. According to some embodiments, for a new given frame of the sequence, a reference frame is generated using a corrected frame previously obtained for a frame of the sequence which is different from the new given frame.

For example, assume that frames $F_1$ to $F_N$ have been obtained. Assume that at a first iteration of the method, frame $F_2$ is corrected based on frame $F_1$ (used as a reference frame), thereby obtaining corrected frame $F'_2$. Assume that the method is repeated to correct frame $F_3$. At operation 215, a different reference frame can be used, which can correspond e.g. to the sum of $F_1$ and $F'_2$. A corrected frame $F_3'$ can be generated. The method can be repeated for another frame $F_4$. At operation 215, a reference frame is generated e.g. as a sum of $F_1$, $F'_2$ and $F'_3$. In other words, the reference frame obtained at the $i^{th}$ iteration of the method can correspond to the sum of the reference frame obtained at the $(i-1)^{th}$ iteration of the method and of the corrected frame obtained at the $(i-1)^{th}$ iteration of the method.

Since the method is repeated, a plurality of corrected frames is obtained. An image of the area can be generated (operation 265) using the plurality of corrected frames. In some embodiments, one or more of the reference frame(s) (generated at 215) can also be used to generate the image.

In the method of FIGS. 2 and 2B, correction of a pattern of a given frame has been described. The method can be applied similarly to a plurality of patterns, as explained with reference to FIG. 3.

The method includes obtaining (operation 300) a sequence of a plurality of frames of an area of the semiconductor specimen. Operation 300 is similar to operation 200 and is not described again.

The method includes obtaining (operation 310) a reference frame based at least on the first frame. Operation 310 is similar to operation 210 and is not described again.

The method includes determining (operation 320), based on the reference frame, a plurality of given reference patterns, wherein each given reference pattern is informative of a given structural feature of the specimen in the area. In other words, each given reference pattern is informative of a different structural feature in the area. As already mentioned above, each given reference pattern can correspond to a reference pixel intensity function associated with the given structural feature in a pixel intensity profile of the reference frame and/or to an image of the given structural feature in the reference frame. For example, a first given reference pattern is informative of a contact, a second given reference pattern is informative of a gate, a third reference pattern is informative of another contact, etc.

Assume that a given frame $F_k$ of the sequence (which is not the first frame) is to be corrected (as mentioned above, this is not limitative, and a plurality of frames can be corrected).

The method can include determining (operation 330), for each given reference pattern informative of a given structural feature, a given pattern which is informative of this given structural feature in the area.

The method can include determining (operation 340) data $D_{shrinkage/given}$ informative of an amplitude of a spatial transformation between the given reference pattern and the given pattern.

For a given frame to be corrected, data $D_{shrinkage/given}$ is specific to each pair of given pattern and reference given pattern. It can therefore differ from one pair to another. This is due to the fact that $D_{shrinkage/given}$ reflects the amplitude of the spatial transformation of the given structural feature due to impingement of the electron beam, and this transformation can vary from a structural feature to another in the area.

In particular, in some embodiments, first data $D_{shrinkage/given,1}$ is informative of an amplitude of a spatial transformation between a first given reference pattern and a first given pattern, and second data $D_{shrinkage/given,2}$ is informative of an amplitude of a spatial transformation between a second given reference pattern and a second given pattern, wherein $D_{shrinkage/given,1}$ is different from $D_{shrinkage/given,2}$.

The method further includes generating (operation 350) a corrected frame $F'_k$. For each given structural feature, the corrected frame is associated with a corrected pattern. The corrected pattern is determined using the given pattern and $D_{shrinkage/given}$ specifically obtained for the given pattern. As mentioned above, the corrected pattern of the corrected frame can be generated based on the given pattern and $D_{shrinkage/given}$ to match, at least partially, the given reference pattern of the reference frame. In other words, effect of the shrinkage is reduced or even eliminated in the corrected frame, for each given structural feature.

In some embodiments, first data $D_{shrinkage/given,1}$ (informative of an amplitude of a spatial transformation between a first given reference pattern and a first given pattern) differs from second data $D_{shrinkage/given,2}$ (informative of an amplitude of a spatial transformation between a second given reference pattern and a second given pattern). Therefore, wherein the corrected frame is associated with a first given corrected pattern informative of the first given structural feature, wherein the first given corrected pattern is based on said first given pattern and $D_{shrinkage/given,1}$ specifically obtained for said first given pattern, and a second given corrected pattern informative of the second given structural feature, wherein the second given corrected pattern is based on said second given pattern and $D_{shrinkage/given,2}$ specifically obtained for said second given pattern.

The method further includes generating (operation 360) an image of the area using at least the corrected frame $F'_k$. The generation can include e.g. summing the reference frame and the corrected frame $F'_k$ (together e.g. with other frames of the sequence and/or other corrected frames).

According to some embodiments, correction of the frame(s) and generation of the image based on the corrected frame(s) can be performed during run-time scanning of the specimen. In other words, the method can be performed in real time or quasi real time on the acquired frames to generate the image. Before generation of the image itself by the electron beam examination tool, the method corrects the frame(s) to generate an image in which effect of shrinkage is reduced or even eliminated. As a consequence, the image of the area is usable for efficient and accurate determination of metrology data of the specimen in the area. This can include e.g. determining critical dimensions, shapes of structural features, etc., regardless of effect of the electron beam on the specimen (which causes physical damages altering the dimensions of the specimen).

Figure 3:
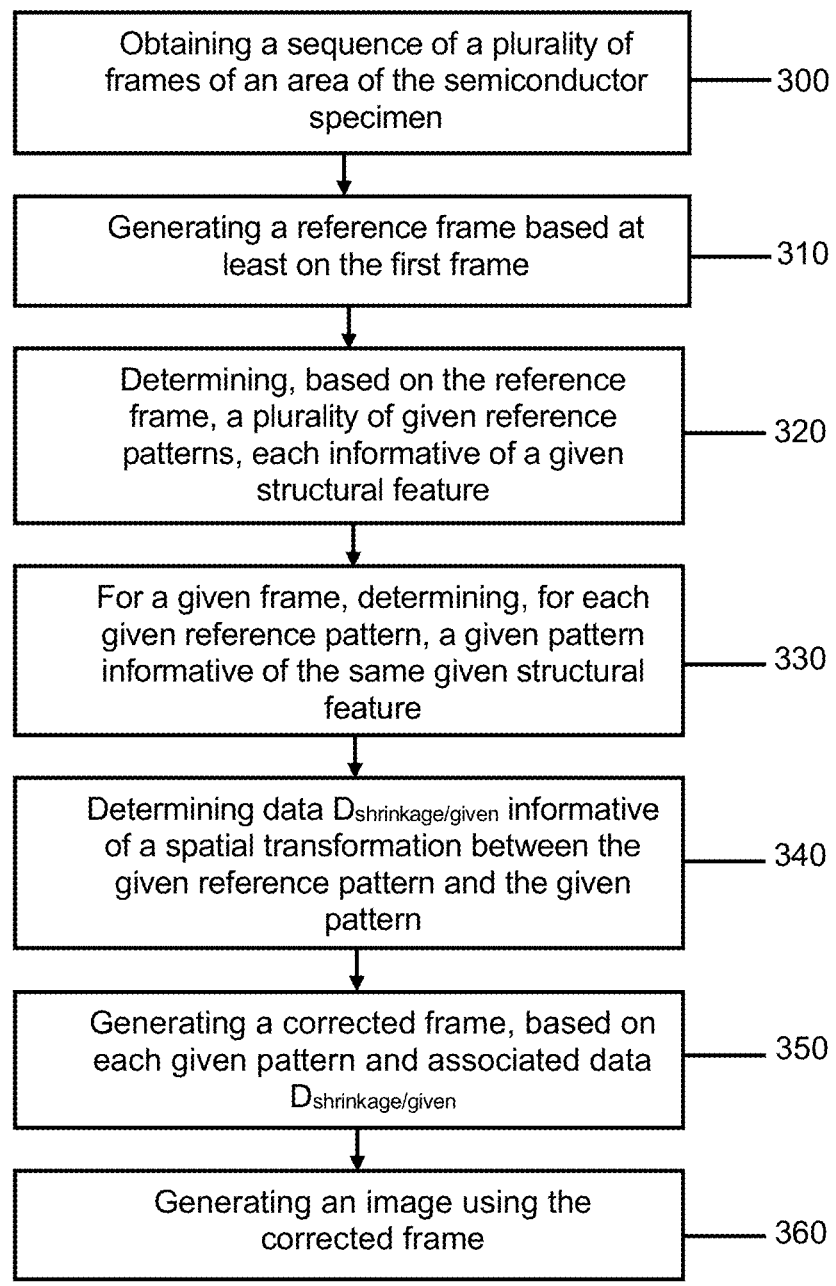
FIG. 3 illustrates a generalized flow-chart of a method of correcting a plurality of patterns in a frame of a specimen acquired by an electron beam examination tool.
Figure 3A:
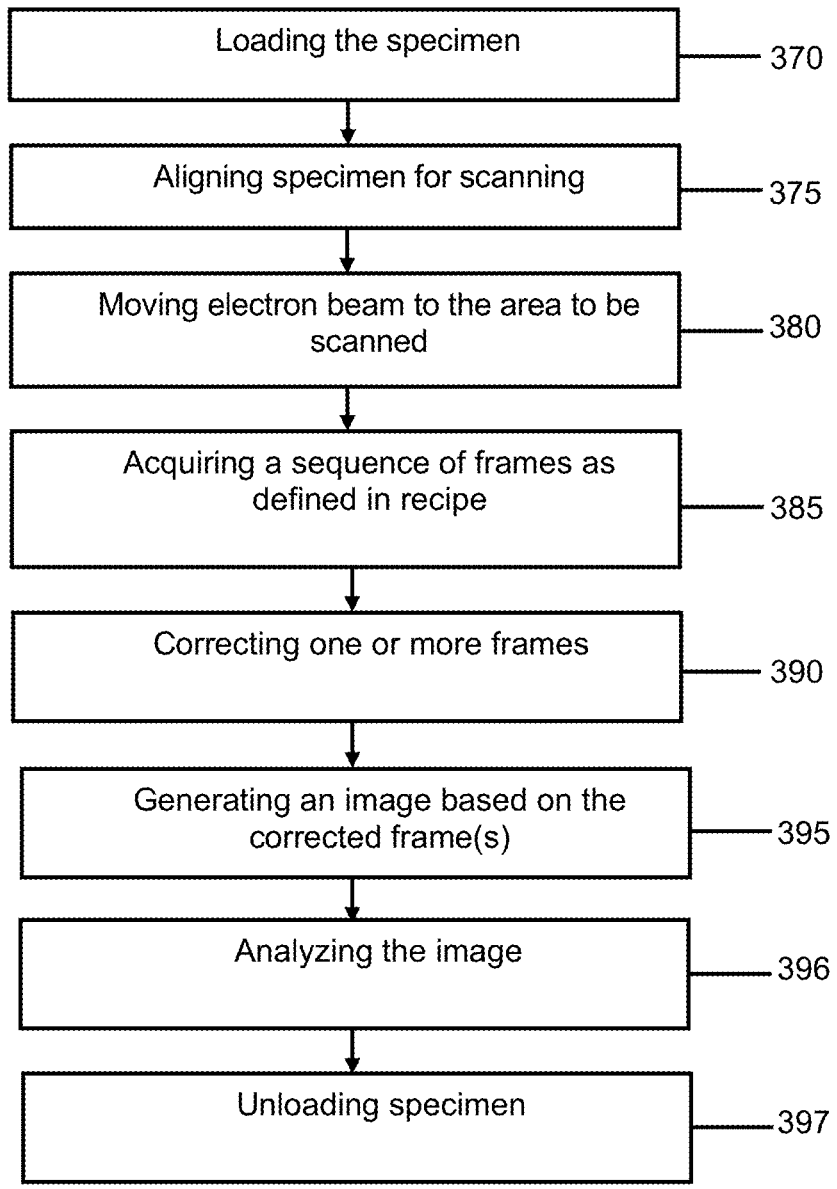
FIG. 3A illustrates a generalized flow-chart of a method of real time correction of the frames and generation of the image.

FIG. 3A illustrates an example of a real time correction of the frames and generation of the image. Scanning of a specimen generally includes loading the specimen (operation 370), aligning the specimen for scanning (operation 375), moving the electron beam to the area to be scanned (operation 380), acquiring a sequence of frames as defined in recipe (operation 385), correcting one or more frames as explained in the various embodiments described above or hereinafter (operation 390), and generating an image based on the corrected frame(s) (operation 395). The image can be used for analysis (operation 396) such as for metrology purposes, and the wafer can be unloaded (operation 397).

Figure 4:
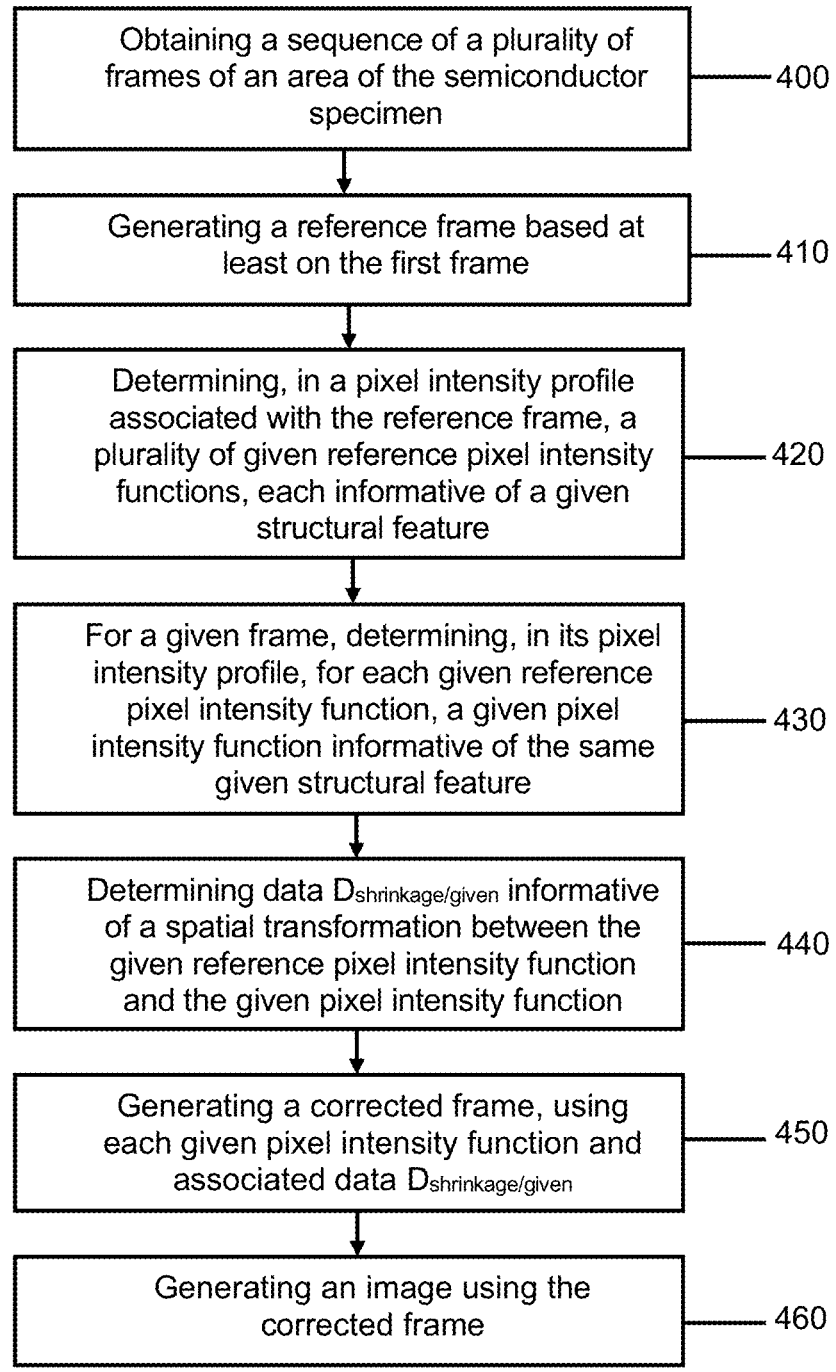
FIG. 4 illustrates an embodiment of the method of FIGS. 2 and 3, based on usage of pixel intensity profile of the frames.
Figure 4A:
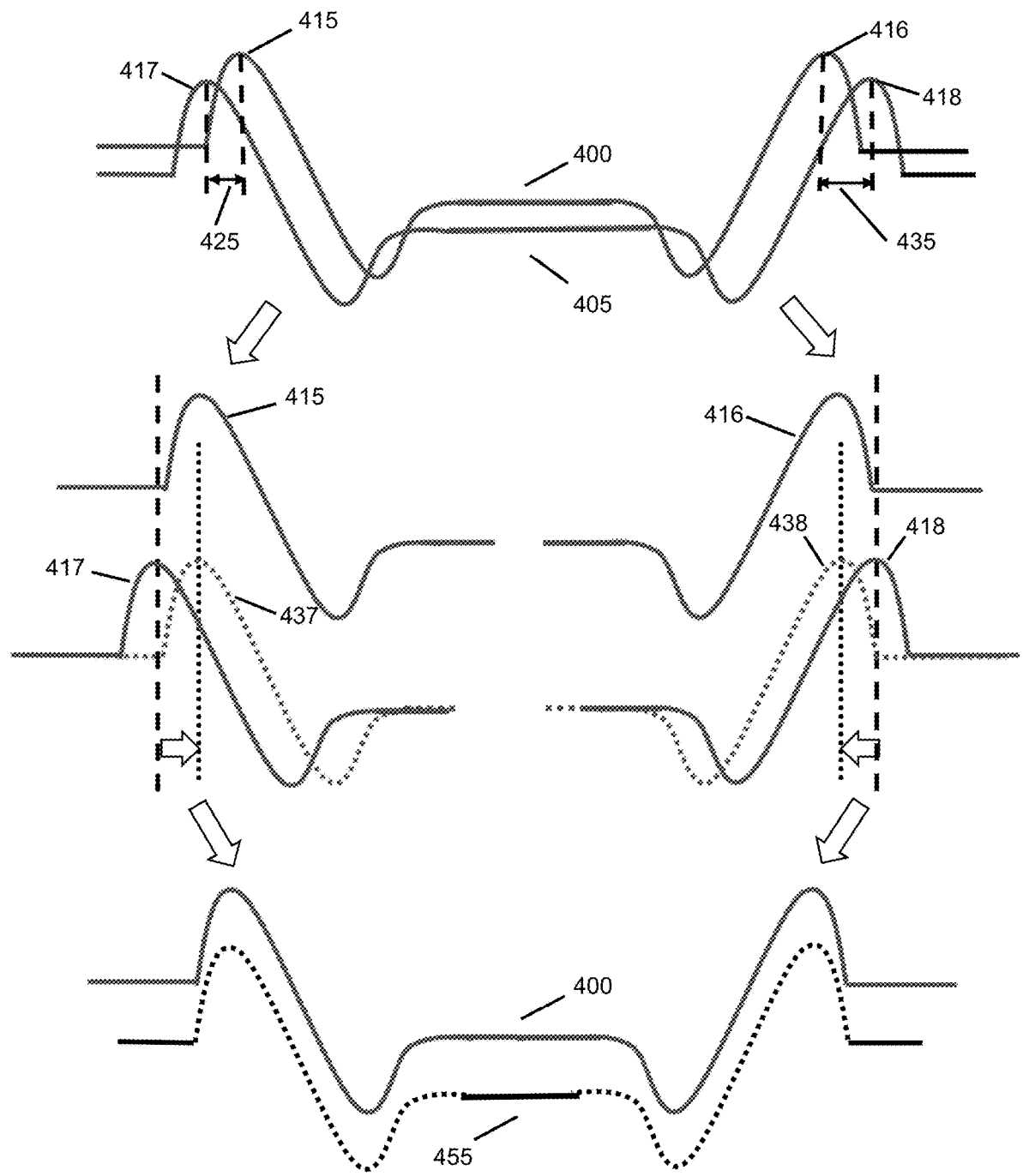
FIGS. 4A and 4B illustrate an example of the method of FIG. 4.
Figure 4B:
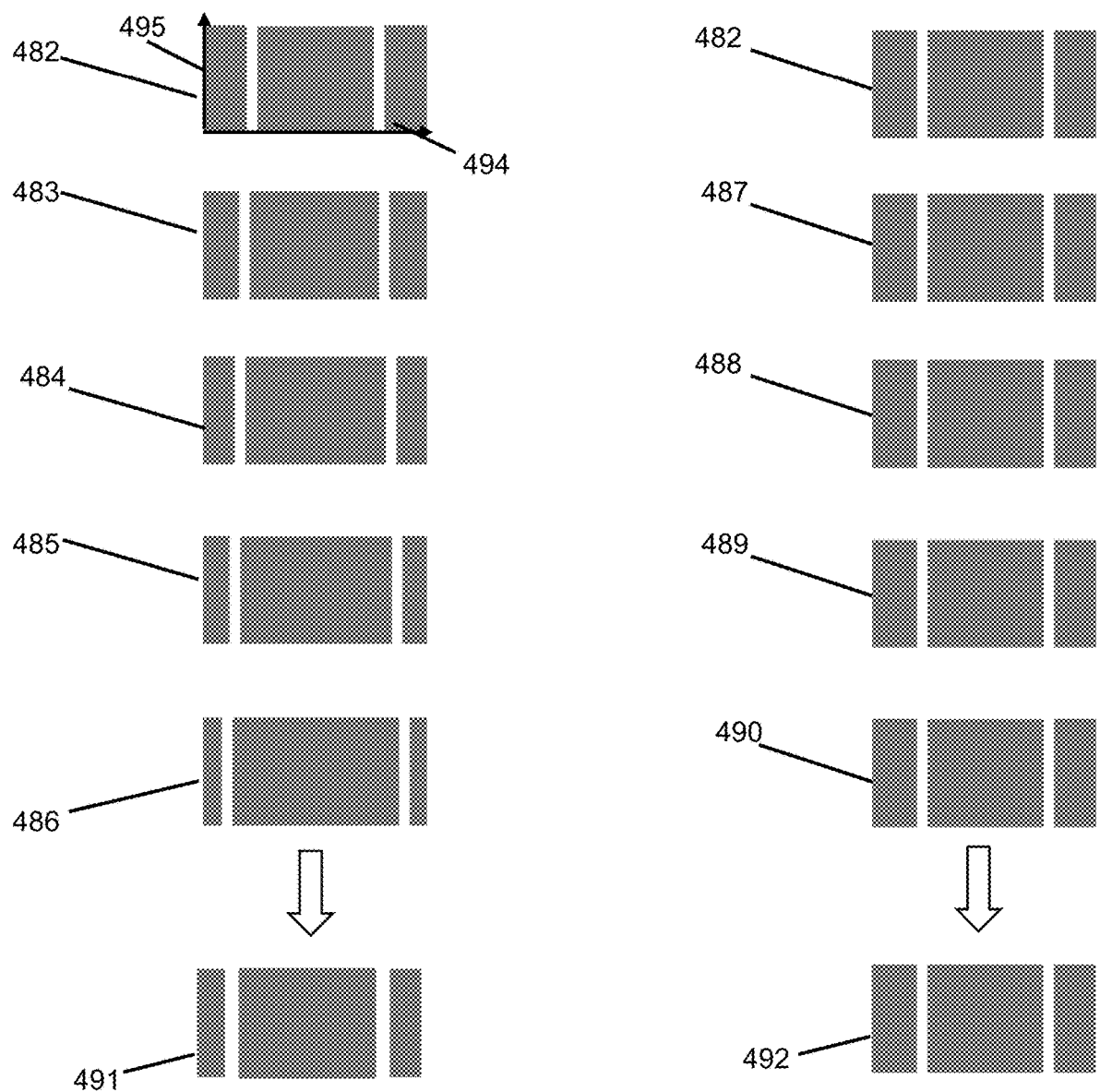

Attention is drawn to FIGS. 4, 4A and 4B which describe a non-limitative example of the methods described above.

The method includes obtaining a sequence of a plurality of frames of an area of the semiconductor specimen (operation 400).

In the example of FIG. 4B, assume that the frames 482 to 486 have been obtained from the electron beam examination tool. These frames are similar to the frames depicted in FIG. 2A.

The method includes obtaining a reference frame based at least on the first frame (operation 410—similar to operation 210).

In the example of FIG. 4B, assume that the first frame 482 is selected as the reference frame.

FIG. 4A depicts a pixel intensity profile 400 associated with the reference frame 482. In this example, this profile corresponds to the average pixel intensity (grey level intensity) in the area along axis "X" (see reference 494 in FIG. 4B), averaged along axis "Y" (see reference 495 in FIG. 4B).

FIG. 4A further depicts a pixel intensity profile 405 associated with another frame to be corrected (e.g. frame 486).

The method includes determining (operation 420), in a pixel intensity profile of the reference frame, a reference pixel intensity function (corresponding to the "reference pattern" or "given reference pattern" in FIGS. 2 and 3) informative of a structural feature of the specimen in the area. In the example of FIG. 4A, two distinct reference pixel intensity functions (first reference pixel intensity function 415 and second reference pixel intensity function 416) are identified. Each function 415, 416 corresponds to a specific peak in the profile 400, which is distinguishable by its specific pattern in the profile 400. Each function 415, 416 can be extracted based e.g. on its specific amplitude and/or shape, which differ from the noise present in each function 415, 416. According to some embodiments, design data (such as CAD data) can be used to provide an estimation of the position of the "peaks". In some embodiments, a template image of the same area can be used to provide an estimation of the position of the "peaks". In some embodiments, the template image is already stored in the recipe and/or in a database for metrology purpose and/or defect inspection purpose. This estimation can be used to determine, in the frame (e.g. reference frame and/or frame to be corrected), the actual position of the "peaks". In both design data and the template image, the image has a higher quality, which facilitates determination of the position of the peaks.

The first reference pixel intensity function 415 is informative of the structural feature 280 (see FIG. 2A). The second reference pixel intensity function 416 is informative of the structural feature 281 (see FIG. 2A). The method does not require to have any knowledge of a link between the functions and the structural features.

The method further includes (operation 430) determining, for each given reference pixel intensity function, a given pixel intensity function (corresponding to the "pattern" or "given pattern" in FIGS. 2 and 3) informative of the same given structural feature. Each given pixel intensity function is identified in a pixel intensity profile associated with the frame to be corrected.

In the example of FIG. 4A, a first pixel intensity function 417 informative of the structural feature 280 is determined in profile 405. It can be identified by searching for a pixel intensity function which is located in the vicinity (with an offset to be determined) of the first reference pixel intensity function 415, and which has a comparable shape and/or amplitude. The method does not require to have any direct knowledge on the structural feature which is represented by the first pixel intensity function. It is sufficient to determine that the first reference pixel intensity function and the first pixel intensity function share similarities and therefore correspond to the same structural feature. In practice, the two functions are offset (the shape of the "peaks" can slightly differ due to shrinkage, which impact e.g. width of the peaks, however, this difference can be neglected with respect to the amplitude of the offset between the peaks).

In the example of FIG. 4A, a second pixel intensity function 418 informative of the structural feature 281 is determined in profile 405. It can be identified as explained for the first pixel intensity function 417.

The method further comprises determining (operation 440) data $D_{shrinkage/given}$ informative of a spatial transformation between the given reference pixel intensity function and the given pixel intensity function.

In the example of FIG. 4A, data $D_{shrinkage,1}$ informative of an amplitude of a spatial transformation between the first reference pixel intensity function 415 and the first pixel intensity function 417 is determined. In this example, $D_{shrinkage,1}$ corresponds to a spatial offset between the peaks of the two functions (as illustrated by arrow 425).

Similarly, data $D_{shrinkage,2}$ informative of an amplitude of a spatial transformation (see spatial offset represented by arrow 435) between the second reference pixel intensity function 416 and the second pixel intensity function 418 is determined. In this method, $D_{shrinkage,2}$ corresponds to a spatial offset between the peaks of the two functions (as illustrated by arrow 435).

The method further includes generating a corrected frame (operation 450) using each given pixel intensity function and associated data $D_{shrinkage/given}$. In particular, each given pixel intensity function can be translated according to $D_{shrinkage/given}$ (such that a position of the given pixel intensity function in a pixel intensity profile of the corrected frame and a position of the given reference pixel intensity function in a pixel intensity profile of the reference frame, match). As a consequence, a (corrected) pixel intensity profile is obtained for the corrected frame, which matches better the pixel intensity profile of the reference frame. The (corrected) pixel intensity profile of the corrected frame includes the various corrected pixel intensity functions which have been determined, as explained above.

In the example of FIG. 4A, profile 405 can be modified such that the first pixel intensity function 417 is translated with an amplitude equal to $D_{shrinkage,1}$, in order to match (to the greatest extent possible) the reference pixel intensity function 415 (and thereby cancelling the effect of the shrinkage for structural feature 280). A corrected first pixel intensity function 437 is obtained. This operation can include "cutting" edges (see FIG. 4A) of the profile 400 (respectively of the profile 405) in order to isolate the first reference pixel intensity function 415 (respectively the first pixel intensity function 417), and then correcting the first pixel intensity function 417.

Similarly, profile 405 can be modified such that the second pixel intensity function 416 is translated with an amplitude equal to $D_{shrinkage,2}$, in order to match (to the greatest extent possible) the reference pixel intensity function 418 (and thereby cancelling the effect of the shrinkage). This can be performed also by cutting "edges" (see FIG. 4A) of profile 405 to isolate respectively the second reference pixel intensity function 416 (respectively the second pixel intensity function 418), and then correcting the second pixel intensity function 418.

The corrected frame is associated with a corrected pixel intensity profile 455, illustrated in FIG. 4A. As a consequence, a corrected frame 490 can be generated, in compliance with the corrected pixel intensity profile 435 (by converting back the pixel intensity profile into a two-dimensional image).

An image is generated using the corrected frame (operation 460). This can include summing the reference frame and the corrected frame (together with other frames of the sequence and/or corrected frames of the sequence).

An output of the method of FIG. 4 is illustrated in FIG. 4B. Frames 483 to 486 are converted respectively into frames 487 to 490. Frame 482, which is the first frame selected as reference frame, is not modified.

Based on the corrected frames, an image 492 can be generated. If the frames had not been corrected, an image 491 would have been generated. As visible in FIG. 4B, metrology data measured on image 492 is of better quality than metrology data measured on image 491 (which is affected by distortion due to shrinkage).

Figure 5:
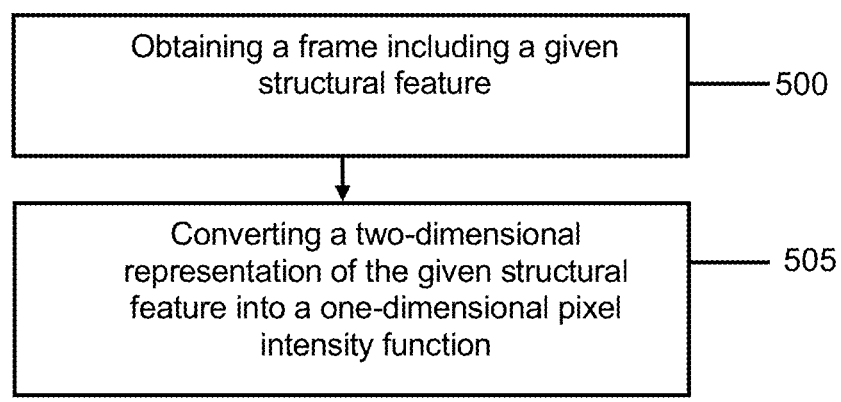
FIG. 5 illustrates a generalized flow-chart of a method of converting a two-dimensional representation of a structural feature in a frame into a one-dimensional pixel intensity function.

Attention is now drawn to FIG. 5. In some embodiments, a frame can be processed as follows. Assume that a given structural feature is present in a frame which has been obtained from the electron beam examination tool (operation 500). The given structural feature appears as a two-dimensional representation in the frame. A method can include converting (operation 505) this two-dimensional representation into a pixel intensity function (one-dimensional function/profile).

Figure 5A:
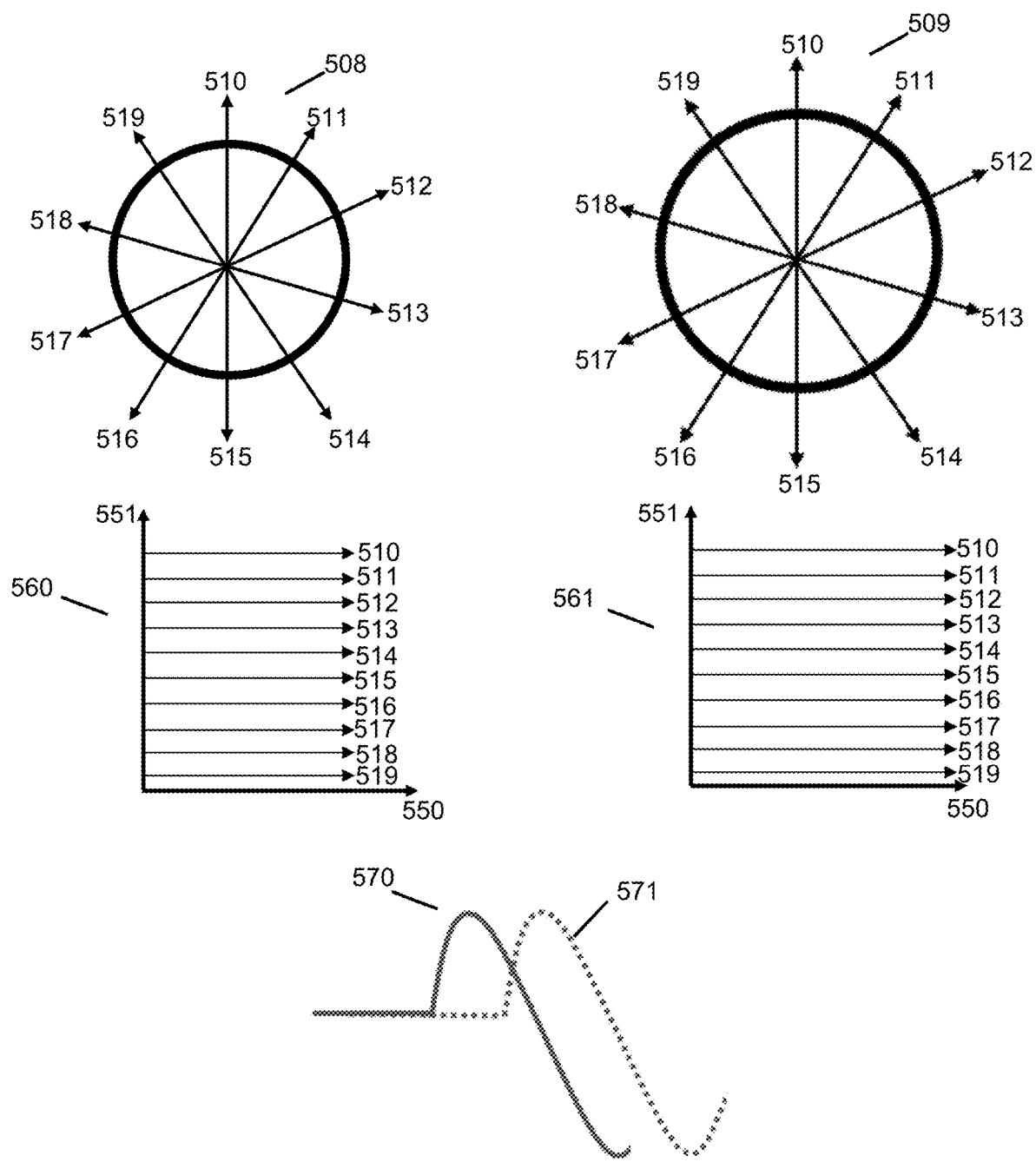
FIG. 5A illustrates an example of the method of FIG. 5.

A non limitative example of the method of FIG. 5 is illustrated in FIG. 5A.

A contact 508 (illustrated as a circle) is acquired in a reference frame. Due to impingement of the electron beam on the contact 508, it appears as a circle 509 of larger diameter in a subsequent frame of the sequence of frames.

Radius of the contact 508 can be measured at various angular positions (see angular positions 510 to 519). The amplitude of the radius of the contact 508 can be represented in a one-dimensional representation 560, in which the horizontal axis 550 corresponds to the amplitude of the radius, and the vertical axis 551 corresponds to the angular position along the contact. The amplitude of the radius of the contact after shrinkage (reference 509) can be represented similarly in a one-dimensional representation 561.

The amplitude of the radius of contact 508 in the one-dimensional representation 560 can be averaged, to obtain reference pixel intensity function 570. The amplitude of the radius of contact 509 in the one-dimensional representation 561 can be averaged, to obtain pixel intensity function 571. Averaging (or a similar aggregation method) generally provides satisfactory results because effect of shrinkage is generally substantially homogenous (or with variations which can be neglected) along a perimeter of a given structural feature (however, this effect can vary between different structural features of the specimen).

The reference pixel intensity function 570 and the pixel intensity function 571 can be processed as explained with reference to FIGS. 4, 4A and 4B. Once the amplitude $D_{shrinkage}$ of the spatial transformation between the pixel intensity function and the reference pixel intensity function has been determined, it is possible to revert to a two-dimensional representation of the contact, which can be used to generate a corrected frame, in which the radius of the contact is corrected according to the amplitude of the spatial transformation (thereby enabling substantial match between the contact after correction and the contact 508 in the reference frame). In some embodiments, once $D_{shrinkage}$ has been determined, a corrected pixel intensity function is determined, and then a corresponding two-dimensional representation is generated in the corrected frame.

Figure 6:
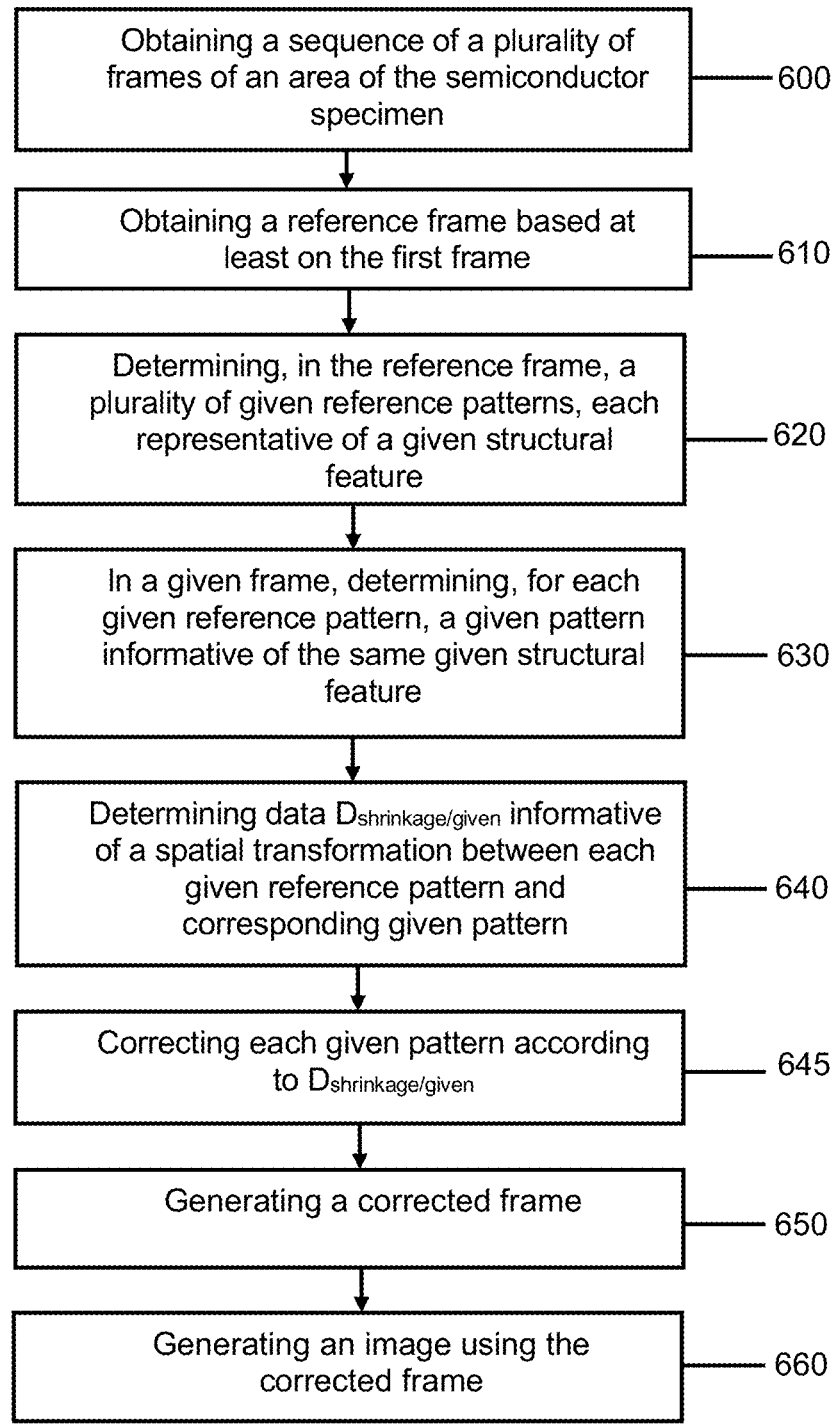
FIG. 6 illustrates an embodiment of the method of FIGS. 2 and 3, based on usage of two-dimensional patterns present in the frames.
Figure 6A:
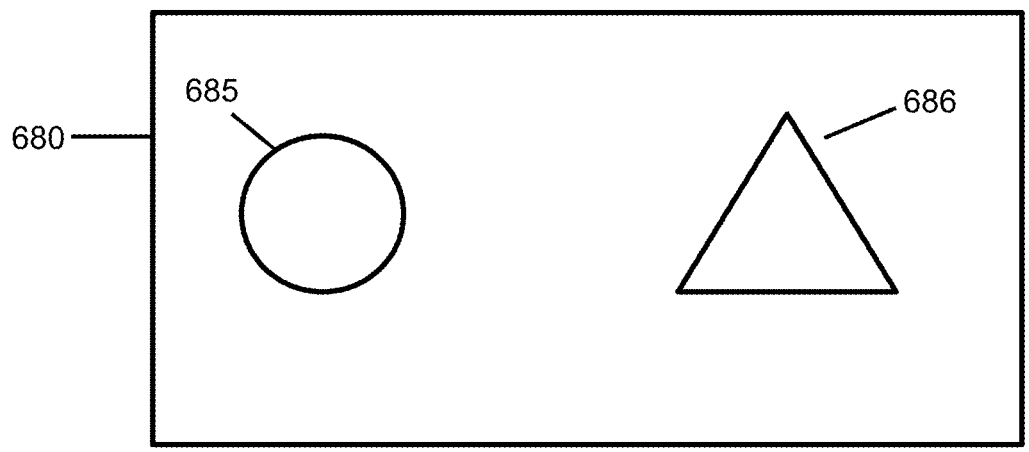
FIGS. 6A to 6C illustrate an example of the method of FIG. 6.
Figure 6A:
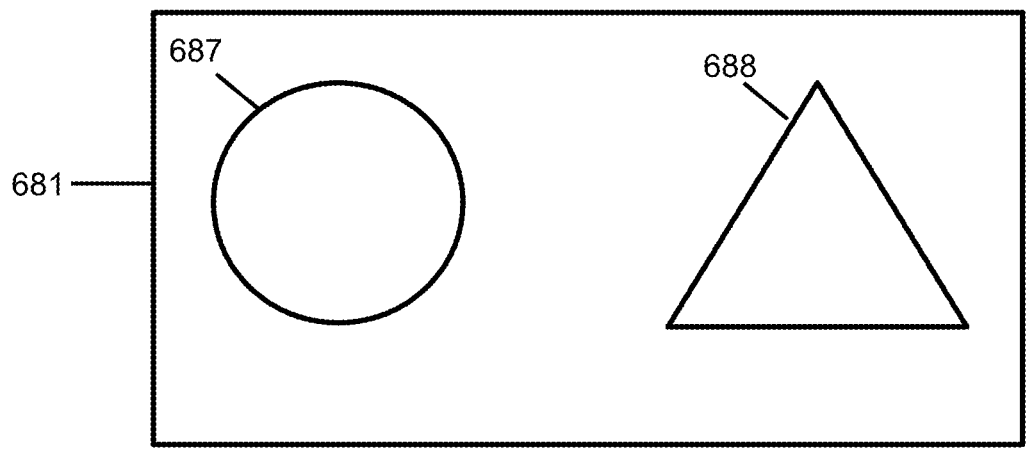

Attention is now drawn to FIGS. 6 and 6A which depict another possible implementation of the methods of FIGS. 2 and 3.

The method includes obtaining a sequence of a plurality of frames of an area of the semiconductor specimen (operation 600) and obtaining a reference frame based on the first frame (operation 610).

In the example of FIG. 6A, the reference frame is noted 680, and the frame to be corrected is noted 681.

The method includes determining (operation 620), in the reference frame, a plurality of given reference patterns. Each given reference pattern represents, in the frame, a given structural feature.

Operation 620 can include determining, for each given reference pattern, location of the edges of the pattern, and the center of the pattern. Operation 620 can involve image processing to determine each given reference pattern.

In some embodiments, operation 620 can rely on design data, such as CAD data, to obtain first information on the position and/or shape of the given reference patterns. Design data provides coordinates of the edges of each given reference pattern. The center can be determined based on the edges (the edges provide the shape of the pattern, and therefore, center of the pattern can be estimated accordingly).

In some embodiments, operation 620 can rely on a template image of the area, to obtain first information on the position and/or shape of the given reference patterns. Edges can be detected in the template image using e.g. segmentation techniques. Once the edges are determined, the center of the pattern can be detected accordingly, as mentioned above.

In the example of FIG. 6A, a first given reference pattern 685 and a second given reference pattern 686 are identified in the reference frame 680.

The method includes determining (operation 630), in the frame to be corrected, a plurality of given patterns. For each given reference pattern informative of a given structural feature, the given pattern is determined to be informative of the same structural feature. In some embodiments, operation 630 can rely on design data, such as CAD data, to facilitate determination of each given pattern.

In the example of FIG. 6A, a first given pattern 687 (informative of the same structural feature as the first given reference pattern 685) and a second given reference pattern 688 (informative of the same structural feature as the second given reference pattern 686) are identified in the frame 681.

The method further includes determining (operation 640), for each given reference pattern, data $D_{shrinkage/given}$ informative of an amplitude of a spatial transformation between the given reference pattern and the given pattern. This can include determining e.g. an aggregated (e.g. average) amplitude of a translation between edges of the given reference pattern and edges and the given pattern. This corresponds to an amplitude of a dilation of the structural feature between the reference frame and the frame to be corrected. Although the amplitude of the dilation can vary depending on a position along the edges of the patterns, it is possible, as mentioned, to determine some average value for $D_{shrinkage/given}$.

According to some embodiments, amplitude of the dilation between the reference pattern and the given pattern can rely on image registration techniques, such as (but not limited to) Fourier transform based techniques, and/or Normalized cross correlation.

Figure 6B:
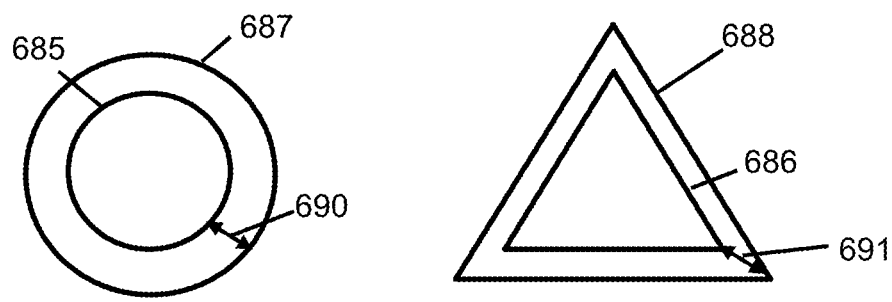

In the example of FIG. 6B, data $D_{shrinkage/given, 1}$ between the first given reference pattern 685 and the first given pattern 687 is illustrated, at a given location, as reference 690. Data $D_{shrinkage/given, 2}$ between the second given reference pattern 686 and the second given pattern 688 is illustrated, at a given location, as reference 691.

The method further includes (operation 645) generating a given corrected pattern for each given pattern. According to some embodiments, each given corrected pattern corresponds to the given pattern to which a dilation of amplitude $D_{shrinkage/given}$ is applied. The given corrected pattern therefore corresponds to the given pattern to which a spatial transformation of amplitude $D_{shrinkage/given}$ is applied to match, at least partially, the given reference pattern. A corrected frame is generated (operation 650), which includes each corrected pattern.

Figure 6C:
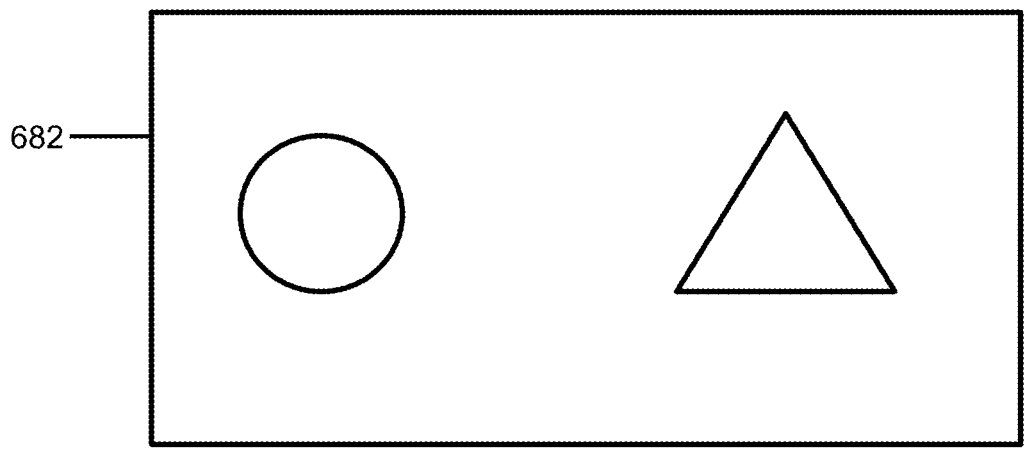

In the example of FIG. 6A, a corrected frame 682 is generated (see FIG. 6C). As shown, the effect of shrinkage has been cancelled.

The method further includes generating an image (operation 660). As mentioned above, the image can be a sum of the reference image and the corrected frame (together with other frames and/or other corrected frames).

As mentioned with reference to FIG. 2B, the method can be repeated for a plurality of frames. Therefore, the method of FIG. 6 can be similarly repeated to obtain a plurality of corrected frames (one corrected frame per frame to be corrected), which can be used to generate an image of the area (e.g. by summing all corrected frames—if necessary together with one or more of the reference frame(s)).

It is to be understood that the invention is not limited in its application to the details set forth in the description contained herein or illustrated in the drawings.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. An electron beam examination system, configured to:
    sequentially acquire a sequence of a plurality of frames of an area of a semiconductor specimen, wherein at least one frame of the sequence is transformed with respect to another frame of the sequence,
    wherein the electron beam examination system comprises a processor and memory circuitry (PMC) configured to:
    obtain a reference frame, wherein the reference frame is based at least on a first frame of the sequence,
    determine, based on the reference frame, a reference pattern, wherein the reference pattern is informative of a structural feature of the specimen in the area,
    for a given frame of the sequence, which is not the first frame:
        determine, based on the given frame, a second pattern informative of said structural feature in the area,
        determine data $D_{shrinkage}$ informative of an amplitude of a spatial transformation between the reference pattern and the pattern, generate a corrected frame associated with a corrected pattern informative of said structural feature, wherein the corrected pattern is based on said pattern and $D_{shrinkage}$, and generate an image of the area using at least the corrected frame, wherein the image is usable for determination of metrology data of the specimen in the area.

2. The system of claim 1, wherein $D_{shrinkage}$ reflects an amplitude of a transformation of the structural feature between the given frame and the reference frame due at least to impingement of an electron beam of the electron beam examination system on the structural feature.

3. The system of claim 1, wherein the corrected pattern of the corrected frame is generated based on said pattern and $D_{shrinkage}$ to match, at least partially, the reference pattern of the reference frame.

4. The system of claim 1, configured to obtain the sequence of the plurality of frames and output the image during run-time scanning of the specimen.

5. The system of claim 1, configured to:
(1) for a given frame of the sequence:
   obtain a reference frame, wherein the reference frame is based at least on a first frame of the sequence,
   determine, based on the reference frame, a reference pattern, wherein the reference pattern is informative of a structural feature of the specimen in the area,
   determine, based on the given frame, a second pattern informative of said structural feature in the area,
   determine data $D_{shrinkage}$ informative of an amplitude of a spatial transformation between the reference pattern and the second pattern,
   generate a corrected frame associated with a corrected pattern informative of said structural feature, wherein the corrected pattern is based on said pattern and $D_{shrinkage}$,
(2) repeat (1) for another frame of the sequence, different from the given frame,
   thereby obtaining a plurality of corrected frames,
generate an image of the area using the plurality of corrected frames, wherein the image is usable for determination of metrology data of the specimen in the area.

6. The system of claim 5, configured to, at (1), for a given frame of the sequence, generate the reference frame using a corrected frame previously obtained for a frame of the sequence which is not the given frame.

7. The system of claim 1, configured to:
determine, based on the reference frame, a plurality of given reference patterns, wherein each given reference pattern is informative of a given structural feature of the specimen in the area,
for a given frame of the sequence, which is not the first frame:
   for each given reference pattern informative of a given structural feature:
      determine, based on the given frame, a given pattern which is informative of said given structural feature in the area,
      determine data $D_{shrinkage/given}$ informative of an amplitude of a spatial transformation between the given reference pattern and the given pattern,
      generate a given corrected frame, wherein, for each given structural feature, the given corrected frame is associated with a given corrected pattern informative of said given structural feature, wherein the given corrected pattern is based on said given pattern and $D_{shrinkage/given}$ specifically obtained for said given pattern,
generate an image of the area using at least the given corrected frame, wherein the image is usable for determination of metrology data of the specimen in the area.

8. The system of claim 7, configured to:
determine first data $D_{shrinkage/given,1}$ informative of an amplitude of a spatial transformation between a first given reference pattern and a first given pattern, and
determine second data $D_{shrinkage/given,2}$ informative of an amplitude of a spatial transformation between a second given reference pattern and a second given pattern,
wherein $D_{shrinkage/given,1}$ is different from $D_{shrinkage/given,2}$,
wherein the corrected frame is associated with:
   a first given corrected pattern informative of the first given structural feature, wherein the first given corrected pattern is based on said first given pattern and $D_{shrinkage/given,1}$ specifically obtained for said first given pattern, and
   a second given corrected pattern informative of the second given structural feature, wherein the second given corrected pattern is based on said second given pattern and $D_{shrinkage/given,2}$ specifically obtained for said second given pattern.

9. The system of claim 1, configured to:
determine, in a pixel intensity profile of the reference frame, a reference pixel intensity function informative of a structural feature of the specimen in the area,
for a given frame of the sequence:
   determine, in a pixel intensity profile of the given frame, a pixel intensity function informative of said structural feature in the area,
   determine data $D_{shrinkage}$ informative of an amplitude of a spatial transformation between the reference pixel intensity function and the pixel intensity function,
   generate a corrected frame, wherein a pixel intensity profile of the corrected frame comprises a corrected pixel intensity function informative of said structural feature, determined based on said pixel intensity function and $D_{shrinkage}$, and
generate an image of the area using at least the corrected frame.

10. The system of claim 9, configured to correct a position of the pixel intensity function based on $D_{shrinkage}$, to obtain the corrected pixel intensity function.

11. The system of claim 1, configured to:
determine, in a pixel intensity profile of the reference frame, a plurality of given reference pixel intensity functions, wherein each given reference pixel intensity function is informative of a given structural feature of the specimen in the area,
for a given frame of the sequence:
   for each given reference pixel intensity function informative of a given structural feature, determine, in a pixel intensity profile of the given frame, a given pixel intensity function informative of said given structural feature in the area,
   determine data $D_{shrinkage/given}$ informative of an amplitude of a spatial transformation between the given reference pixel intensity function and the given pixel intensity function,
   generate a corrected frame, wherein, for each given structural feature, a pixel intensity profile of the corrected frame comprises a corrected given pixel intensity function informative of said given structural feature, determined based on said given pixel intensity function and $D_{shrinkage/given}$ specifically obtained for said given pixel intensity function, and generate an image of the area using at least the corrected frame.

12. A method of examination of a semiconductor specimen, the method comprising by a processor and memory circuitry (PMC):
obtaining a sequence of a plurality of frames of an area of the semiconductor specimen, sequentially acquired by an electron beam examination tool, wherein at least one frame of the sequence is transformed with respect to another frame of the sequence,
obtaining a reference frame based at least on a first frame of the sequence,
determining, based on the reference frame, a reference pattern, wherein the reference pattern is informative of a structural feature of the specimen in the area,
for a given frame of the sequence, which is not the first frame:
  determining, based on the given frame, a pattern informative of said structural feature in the area,
  determining data $D_{shrinkage}$ informative of an amplitude of a spatial transformation between the reference pattern and the pattern,
  generating a corrected frame associated with a corrected pattern informative of said structural feature, wherein the corrected pattern is based on said pattern and $D_{shrinkage}$, and
generating an image of the area using at least the corrected frame,
wherein the image is usable for determination of metrology data of the specimen in the area.

13. The method of claim 12, wherein the corrected pattern of the corrected frame is generated based on said pattern and $D_{shrinkage}$ to match, at least partially, the reference pattern of the reference frame.

14. The method of claim 12, comprising obtaining the sequence of the plurality of frames and outputting the image during run-time scanning of the specimen by the electron beam examination tool.

15. The method of claim 12, comprising:
determining, based on the reference frame, a plurality of given reference patterns, wherein each given reference pattern is informative of a given structural feature of the specimen in the area,
for a given frame of the sequence, which is not the first frame:
  for each given reference pattern informative of a given structural feature:
    determining, based on the given frame, a given pattern which is informative of said given structural feature in the area,
    determining data $D_{shrinkage/given}$ informative of an amplitude of a spatial transformation between the given reference pattern and the given pattern,
    generating a given corrected frame, wherein, for each given structural feature, the given corrected frame is associated with a given corrected pattern informative of said given structural feature, wherein the given corrected pattern is based on said given pattern and $D_{shrinkage/given}$ specifically obtained for said given pattern, and
generating an image of the area using at least the given corrected frame, wherein the image is usable for determination of metrology data of the specimen in the area.

16. The method of claim 15, comprising:
determining first data $D_{shrinkage/given,1}$ informative of an amplitude of a spatial transformation between a first given reference pattern and a first given pattern, and
determining second data $D_{shrinkage/given,2}$ informative of an amplitude of a spatial transformation between a second given reference pattern and a second given pattern,
wherein $D_{shrinkage/given,1}$ is different from $D_{shrinkage/given,2}$,
wherein the corrected frame is associated with:
  a first given corrected pattern informative of the first given structural feature, wherein the first given corrected pattern is based on said first given pattern and $D_{shrinkage/given,1}$ specifically obtained for said first given pattern,
  a second given corrected pattern informative of the second given structural feature, wherein the second given corrected pattern is based on said second given pattern and $D_{shrinkage/given,2}$ specifically obtained for said second given pattern.

17. The method of claim 12, comprising:
determining, in a pixel intensity profile of the reference frame, a reference pixel intensity function informative of a structural feature of the specimen in the area,
for a given frame of the sequence:
  determining, in a pixel intensity profile of the given frame, a pixel intensity function informative of said structural feature in the area,
  determining data $D_{shrinkage}$ informative of an amplitude of a spatial transformation between the reference pixel intensity function and the pixel intensity function,
  generating a corrected frame, wherein a pixel intensity profile of the corrected frame comprises a corrected pixel intensity function informative of said structural feature, determined based on said pixel intensity function and $D_{shrinkage}$, and
generating an image of the area using at least the corrected frame.

18. The method of claim 17, comprising correcting a position of the pixel intensity function based on $D_{shrinkage}$, to obtain the corrected pixel intensity function.

19. The method of claim 17, comprising at least one of:
converting a two-dimensional representation of the structural feature in the reference frame into the reference pixel intensity function, and
converting a two-dimensional representation of the structural feature in the frame into the pixel intensity function.

20. A non-transitory computer readable medium comprising instructions that, when executed by a processor, cause the processor to perform operations comprising:
obtaining a sequence of a plurality of frames of an area of a semiconductor specimen, sequentially acquired by an electron beam examination tool, wherein at least one frame of the sequence is transformed with respect to another frame of the sequence,
obtaining a reference frame based at least on a first frame of the sequence,
determining, based on the reference frame, a reference pattern, wherein the reference pattern is informative of a structural feature of the specimen in the area,
for a given frame of the sequence, which is not the first frame:
  determining, based on the given frame, a pattern informative of said structural feature in the area, determining data $D_{shrinkage}$ informative of an amplitude of a spatial transformation between the reference pattern and the pattern, generating a corrected frame associated with a corrected pattern informative of said structural feature, wherein the corrected pattern is based on said pattern and $D_{shrinkage}$;

generating an image of the area using at least the corrected frame, wherein the image is usable for determination of metrology data of the specimen in the area.

* * * * *